United States Patent
Kwon et al.

(10) Patent No.: US 10,916,735 B2
(45) Date of Patent: Feb. 9, 2021

(54) DISPLAY DEVICE AND METHOD OF MANUFACTURING THE SAME

(71) Applicant: Samsung Display Co., Ltd., Yongin-Si (KR)

(72) Inventors: Ohjune Kwon, Hwaseong-si (KR); Moonwon Chang, Hwaseong-si (KR); Seungwook Kwon, Hwaseong-si (KR); Hyojeong Kwon, Seoul (KR); Doohwan Kim, Yongin-si (KR); Minsang Kim, Suwon-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 15 days.

(21) Appl. No.: 16/127,413

(22) Filed: Sep. 11, 2018

(65) Prior Publication Data

US 2019/0165332 A1 May 30, 2019

(30) Foreign Application Priority Data

Nov. 24, 2017 (KR) .................. 10-2017-0158830

(51) Int. Cl.
*H01L 51/56* (2006.01)
*G09G 3/3208* (2016.01)
(Continued)

(52) U.S. Cl.
CPC .............. *H01L 51/56* (2013.01); *G09F 9/301* (2013.01); *G09G 3/3208* (2013.01); *H01L 27/3223* (2013.01); *H01L 27/3246* (2013.01); *H01L 51/0097* (2013.01); *H01L 51/5056* (2013.01); *H01L 51/5072* (2013.01);
(Continued)

(58) Field of Classification Search
CPC . H01L 51/56; H01L 51/0097; H01L 51/5056; H01L 51/5092; H01L 51/5221; H01L 27/3246; H01L 51/5206; H01L 51/5072; H01L 27/3211; H01L 51/5237; H01L 27/323; H01L 27/3276;
(Continued)

(56) References Cited

U.S. PATENT DOCUMENTS 9,048,443 B2 6/2015 Namkung et al.
9,516,743 B2 12/2016 Kim et al.
(Continued)

FOREIGN PATENT DOCUMENTS

KR 1020150007632 A 1/2015
KR 1020150094989 A 8/2015
(Continued)

*Primary Examiner* — Mouloucoulaye Inoussa
(74) *Attorney, Agent, or Firm* — Cantor Colburn LLP

(57) ABSTRACT

A display device includes a display panel including: a bending area at which the display panel is bent with reference to a bending axis, and a non-bending area at which the display panel is not bent and at which an image is displayed; and a support member on which is supported the display panel, defining: a recessed portion disposed in the bending area; first and second bumps spaced apart from each other to define the recessed portion therebetween; and extensions extended from the first and second bumps, in a direction away from the recessed portion, to opposing ends of the support member, respectively. In cross-section, a size of the first bump is different from a size of the second bump.

16 Claims, 17 Drawing Sheets

(51) Int. Cl.
    *H01L 51/00*         (2006.01)
    *G09F 9/30*         (2006.01)
    *H01L 51/50*         (2006.01)
    *H01L 51/52*         (2006.01)
    *H01L 27/32*         (2006.01)

(52) U.S. Cl.
    CPC ........ *H01L 51/5092* (2013.01); *H01L 51/525* (2013.01); *H01L 51/5206* (2013.01); *H01L 51/5221* (2013.01); *G09G 2310/0264* (2013.01); *H01L 27/3211* (2013.01); *H01L 51/5253* (2013.01); *H01L 2227/323* (2013.01); *H01L 2251/5338* (2013.01)

(58) Field of Classification Search
    CPC ... H01L 51/5253; G09G 3/3208; G09F 9/301; B32B 37/14; B32B 38/00; B32B 38/1833
    USPC .......................................................... 257/40
    See application file for complete search history.

(56) References Cited

U.S. PATENT DOCUMENTS

| | | |
|---|---|---|
| 9,614,168 B2 | 4/2017 | Zhang et al. |
| 9,627,463 B2 | 4/2017 | Kwon et al. |
| 10,212,811 B1* | 2/2019 | Zhang .................. G06F 1/1652 |
| 2014/0240985 A1* | 8/2014 | Kim ...................... H05K 1/028 362/249.04 |
| 2014/0306941 A1* | 10/2014 | Kim .................... H01L 51/0097 345/204 |
| 2015/0137102 A1* | 5/2015 | Yang ..................... B32B 37/144 257/40 |
| 2015/0227172 A1 | 8/2015 | Namkung et al. |
| 2016/0204183 A1* | 7/2016 | Tao ....................... H01L 25/167 257/40 |
| 2016/0275830 A1 | 9/2016 | You et al. |
| 2017/0045914 A1* | 2/2017 | Namkung ............. G06F 1/1652 |
| 2018/0007789 A1* | 1/2018 | Kawata ............... H01L 27/3244 |
| 2018/0061728 A1* | 3/2018 | Chen ................... H01L 27/1248 |
| 2018/0090701 A1* | 3/2018 | Senda ................. H01L 51/0097 |

FOREIGN PATENT DOCUMENTS

| | | |
|---|---|---|
| KR | 1020160111839 A | 9/2016 |
| KR | 1020170091587 A | 8/2017 |

* cited by examiner

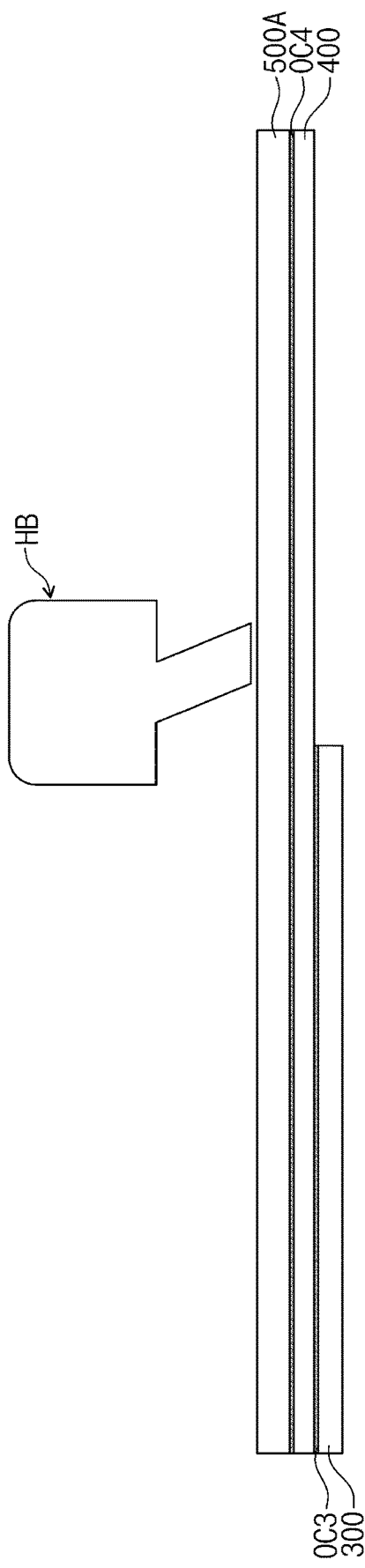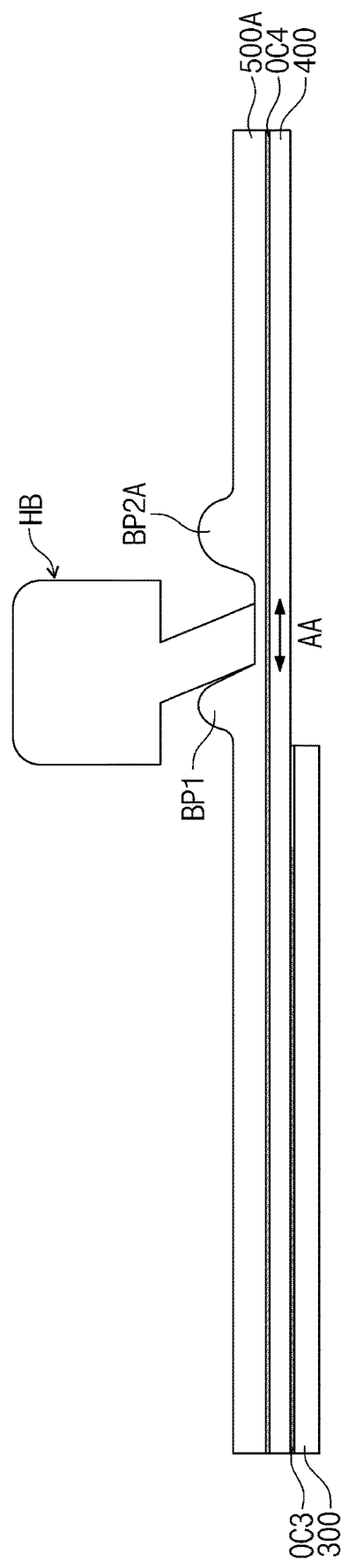

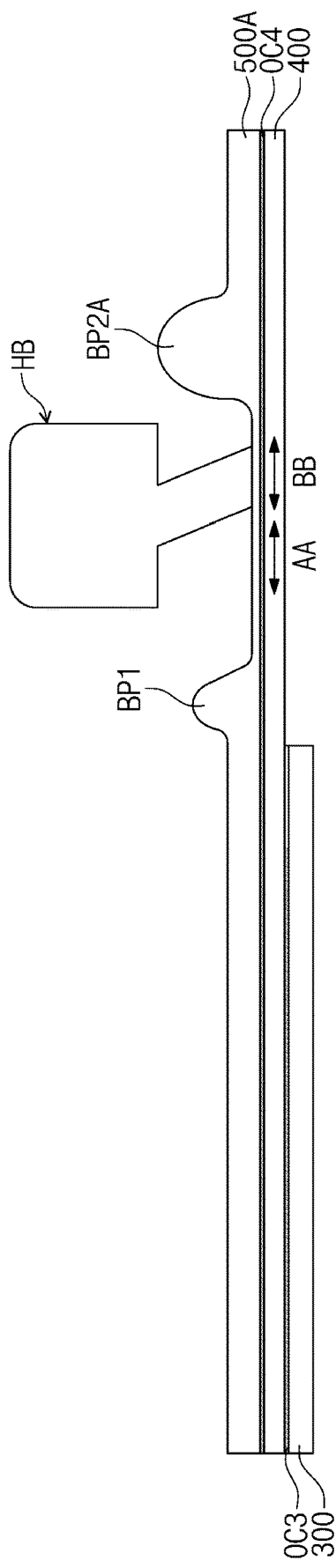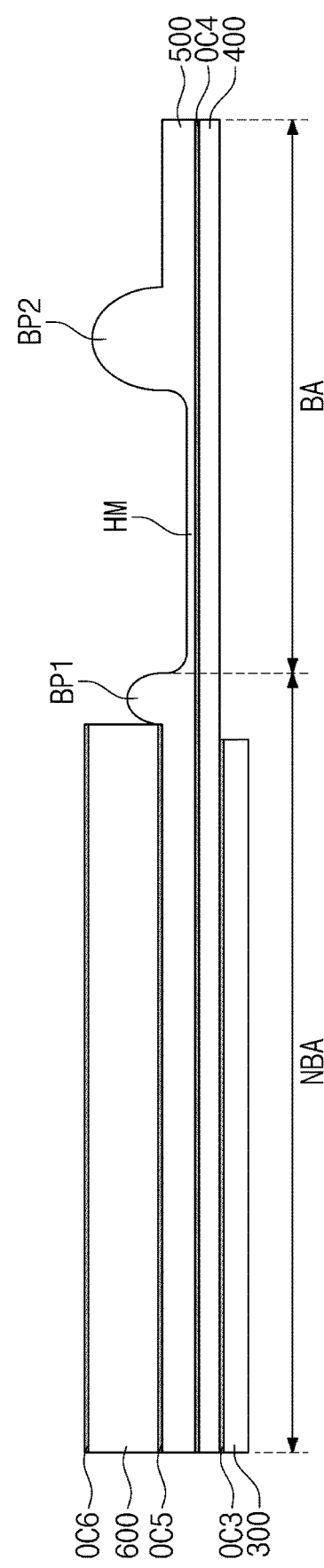

DISPLAY DEVICE AND METHOD OF MANUFACTURING THE SAME

This application claims priority to Korean Patent Application No. 10-2017-0158830, filed on Nov. 24, 2017, and all the benefits accruing therefrom under 35 U.S.C. § 119, the content of which in its entirety is herein incorporated by reference.

BACKGROUND

1. Field

Embodiments of the invention relate to a display device and a method of manufacturing the same and, more particularly, to a display device having a reduced bezel and improved bending characteristics and a method of manufacturing the same.

2. Description of the Related Art

Electronic devices such as smart phones, tablets, notebook computers and smart televisions have been developed. These electronic devices include display devices to provide information. The electronic devices further include various electronic modules in addition to the display devices.

To realize a slim bezel, an electronic device may include a display device of which a portion is bent.

SUMMARY

Embodiments of the invention may provide a display device having improved bending characteristics thereof.

Embodiments of the invention may also provide a method of manufacturing a display device formable with improved manufacturing process efficiency.

In an embodiment of the invention, a display device may include a display panel which displays an image, including: a bending area at which the display panel is bent with reference to a bending axis, and a non-bending area which extends from the bending area, at which the display panel is not bent and at which the image is displayed; and a support member on which is supported the display panel. The support member defines: a recessed portion disposed in the bending area; a first bump and a second bump spaced apart from each other to define the recessed portion therebetween; and extensions extended from the first bump and the second bump in a direction away from the recessed portion, to opposing ends of the support member, respectively. In cross-section, a size of the first bump is different from a size of the second bump.

The recessed portion may extend in a direction in which the bending axis extends.

In cross-section, a maximum thickness of the support member at the recessed portion thereof may be less than a minimum thickness of the extensions.

The first bump overlapping the non-bending area, and the second bump overlapping the bending area.

In cross-section from a rear surface of the support member a maximum height of the first bump may be less than a maximum height of the second bump.

Lengths of each of the first bump and the second bump may extend in a same direction in which a length of the bending axis extends.

The bending area of the display panel may extend from the non-bending area thereof in an extending direction. In the extending direction, a width of the first bump may be less than a width of the second bump.

In the non-bending area, the display device may further include a first protective film disposing the support member between the first protective film and the display panel.

When the display panel is bent along the bending axis, the second bump is adhered to the first protective film.

The first protective film may define an opening therein disposed in the non-bending area of the display panel, and the second bump in the opening.

In the non-bending area, the display device may further include a second protective film disposing the first protective film between the second protective film and the support member. The first protective film and the second protective film may be stacked to have a stepped region, and the second bump of the support member in contact with an inner surface of the first protective film or the second protective film at the stepped region formed therewith.

The display device may further include a window member disposed on the display panel and through which the image displayed by the display panel is viewable outside the display device, an anti-reflection layer disposed between the window member and the display panel, and an input sensing layer with which an input to the display device is sensed, the input sensing layer disposing the anti-reflection layer between the window member and the input sensing layer.

The support member may include a thermoplastic resin.

In another embodiment of the invention, a display device may include a base member including a first area at which an image is displayed and a second area which extends from the first area in a first direction and at which the image is not displayed; a display element layer with which the image is displayed, disposed on the base member in the first area thereof; a driving circuit electrically connected to the display element layer and with which the display element layer is controlled to display the image, disposed on the base member in the second area thereof; a signal line electrically connecting the display element layer in the first area to the driving circuit in the second area; and a support member on which is supported the base member including the display element layer, the driving circuit and the signal line thereon. The support member defines: a recessed portion disposed in the bending area; a first bump and a second bump spaced apart from each other in the first direction to define the recessed portion therebetween; and extensions extending away the first bump and the second bump, to opposing ends of the support member, respectively. Along the first direction, the first bump of the support member is disposed closer to the display element layer than the second bump of the support member, and in cross-section, a size of the first bump is different from a size of the second bump.

A length of the recessed portion may extend in a second direction intersecting the first direction.

In cross-section, a minimum thickness of the extensions of the support member is greater than a maximum thickness of the support member at the recessed portion thereof.

In cross-section from a rear surface of the support member, a maximum height of the first bump may be less than a maximum height of the second bump.

Along the first direction, a width of the first bump may be less than a width of the second bump.

In still another embodiment of the invention, a method of manufacturing a display device may include providing a preliminary display device including: a display panel which displays an image, including a pixel with which the image is displayed, the pixel disposed on a top surface of a base member of the display panel, where the base member includes a first area in which the pixel is disposed and at which the image is displayed, and a second area which extends from the first area in an extending direction and at which the image is not displayed; and a base support member facing a bottom surface of the base member which is opposite to the top surface thereof, in the first and second areas of the base member; at a portion of the base support member which corresponds to the second area of the base member: first pressing the base support member at a first press area thereof, by using a heating block to deform the base support member and form a first bump and a preliminary bump spaced apart from each other along the extending direction; and second pressing the base support member at a second press area spaced apart from the first bump, by using the heating block to deform the base support member and form from the preliminary bump a second bump spaced apart from the first bump along the extending direction; and bending the second area of the display panel and the portion of the base support member corresponding thereto with reference to a bending axis after the second pressing, to dispose the first bump and the second bump of the base support member each overlapping the first area of the display panel, and form the display device.

The first press area may overlap with the second press area, and the second pressing the base support member may further deform a portion of the base support member at the first press area which is adjacent to the preliminary bump to increase a size of the preliminary bump and form the second bump spaced apart from the first bump along the extending direction.

The second pressing the base support member may define a recessed portion of the base support member between the first bump and the second bump, and the recessed portion of the base support member corresponds to the second area of the display panel.

BRIEF DESCRIPTION OF THE DRAWINGS

The above and other features of the invention will become more apparent by describing in further detail exemplary embodiments thereof with reference to the accompanying drawings, in which:

FIGS. 8B to 8F are cross-sectional views illustrating an embodiment of a method of manufacturing a display device, according to the invention.

DETAILED DESCRIPTION

Figure 1A:
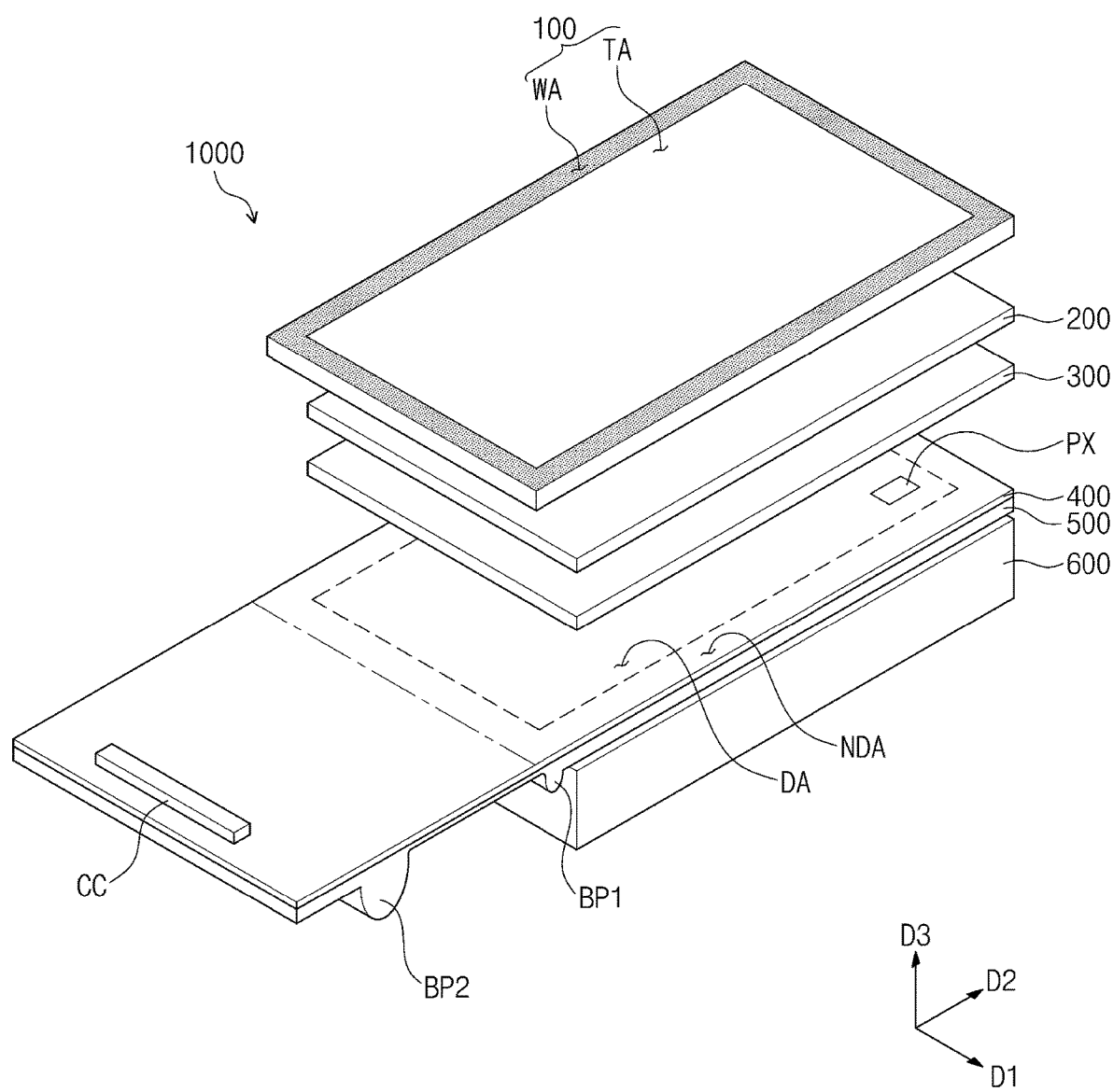
FIG. 1A is an exploded perspective view illustrating an embodiment of a display device according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element such as a layer, region or substrate is referred to as being related to another element such as being "on" another element, it can be directly on the other element or intervening elements may be present. In contrast, when an element such as a layer, region or substrate is referred to as being related to another element such as being "directly on" another element, there are no intervening elements.

As used herein, the term "and/or" includes any and all combinations of one or more of the associated listed items. The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

To realize a slim bezel, an electronic device may include a display device of which a portion is bent. In a process of bending the display device an undesired space may be defined at a bending area of the display device due to a structure of a bump formed in the bending area. Thus, realizing a slim bezel for the display device may be difficult owing to the space related to the bump.

Figure 1B:
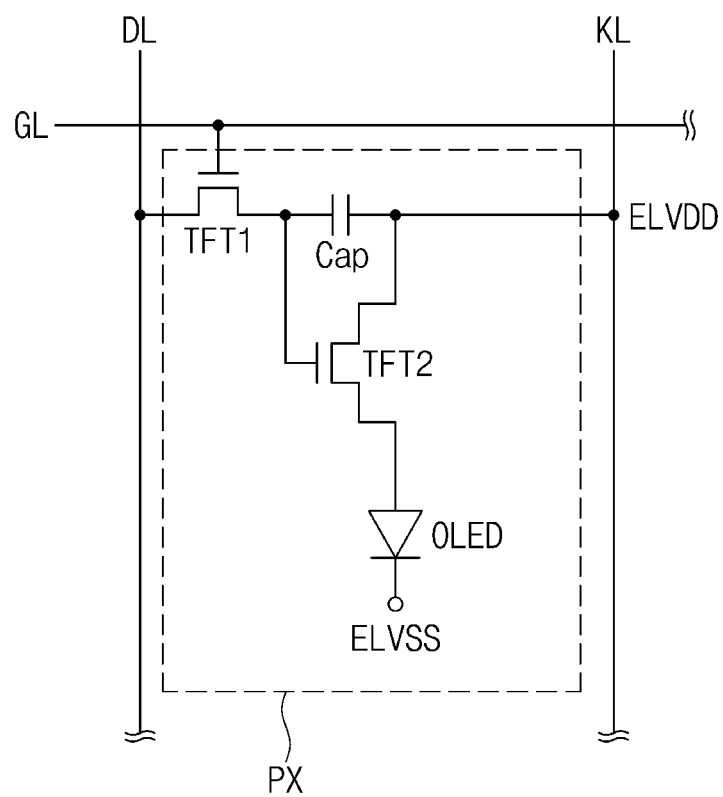
FIG. 1B is an equivalent circuit diagram of an embodiment of a pixel of a display device according to the invention.
Figure 2A:
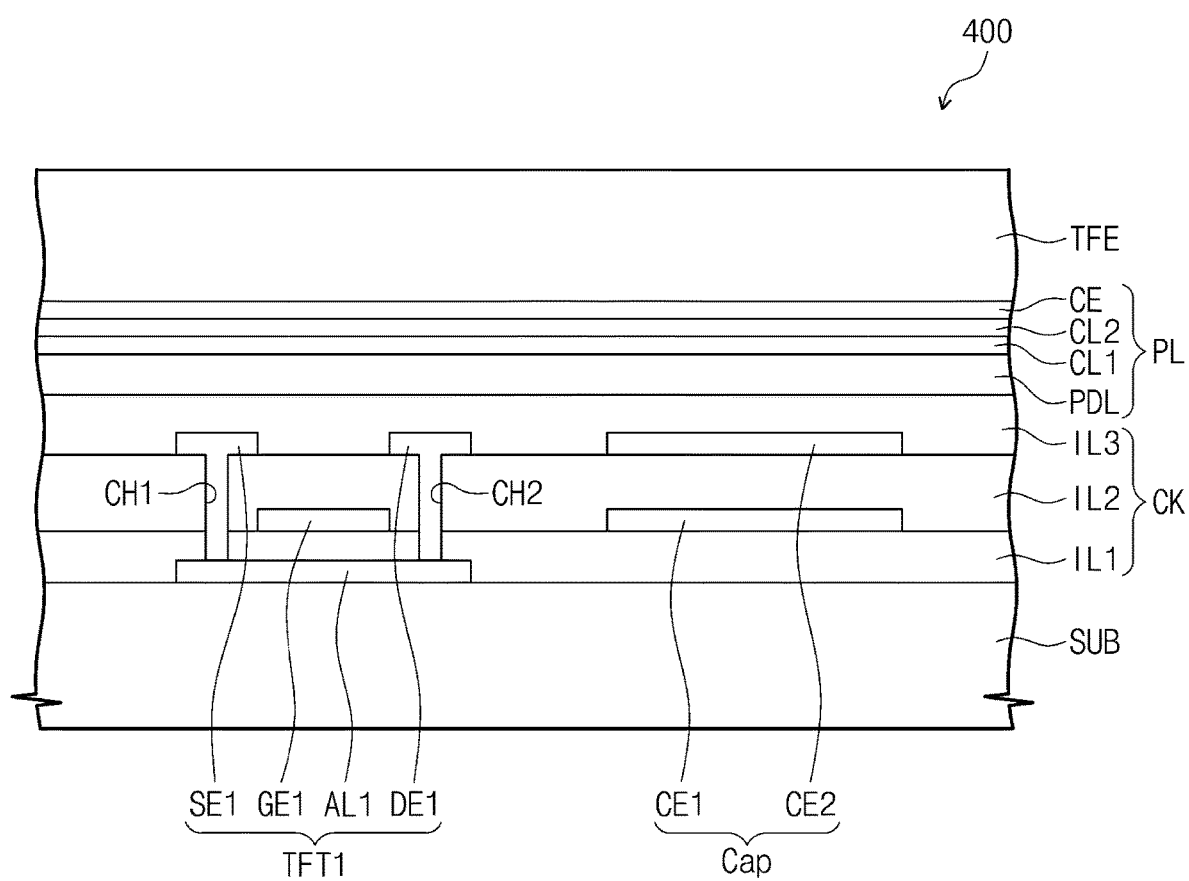
FIGS. 2A and 2B are cross-sectional views illustrating embodiments of portions of a display device according to the invention.
Figure 2B:
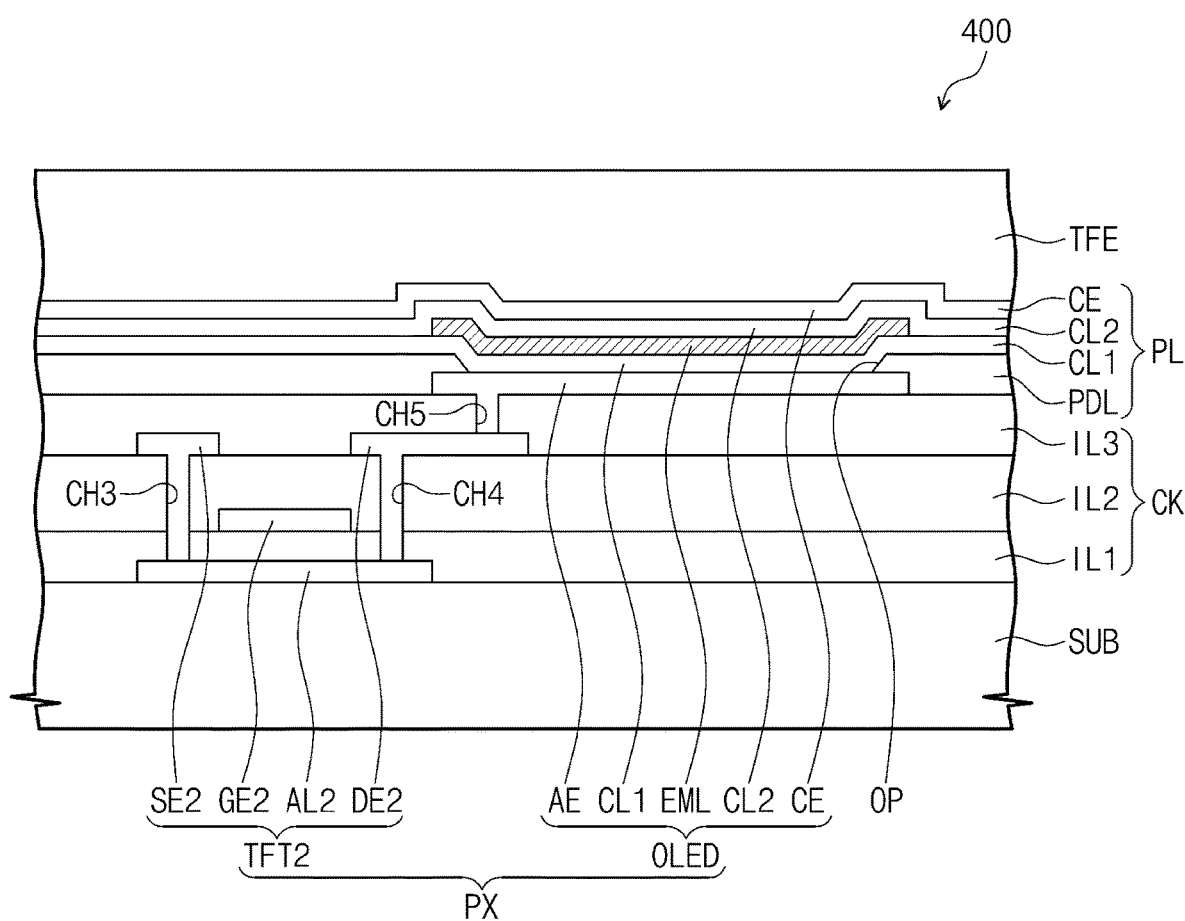

FIG. 1A is an exploded perspective view illustrating an embodiment of a display device according to the invention. FIG. 1B is an equivalent circuit diagram of an embodiment of a pixel of a display device according to the invention. FIGS. 2A and 2B are cross-sectional views illustrating embodiments of portions of a display device according to the invention. Hereinafter, a display device according to an embodiment will be described in detail with reference to FIGS. 1A, 1B, 2A and 2B.

As illustrated in FIG. 1A, a display device 1000 may include a window member 100, an anti-reflection unit 200, an input sensing unit 300, a display panel 400, a support member 500 and a protective film 600.

For the purpose of ease and convenience in description, a direction in which the display device 1000 provides an image is defined as an upward direction and a direction opposite to the upward direction is defined as a downward direction. In the present embodiment, the upward and downward directions are parallel to a third direction D3 defined as a direction perpendicular to a first direction D1 and a second direction D2. The third direction D3 may be a reference direction which is used to define a front surface (or one surface) and a rear surface (another surface) of each of components to be described below. However, the upward and downward directions may be relative concepts and may be changed into other directions. The display device 1000 and components thereof may be flat as being disposed within a plane defined by the first direction D1 and the second direction D2.

The window member 100 may include a light transmitting portion TA at which an image provided by the display panel 400 is transmitted to outside the display device 1000 (e.g., at a viewing side thereof), and a light shielding portion WA which is adjacent to the light transmitting portion TA and at which the image provided by the display panel 400 is not transmitted.

The light transmitting portion TA may be disposed at a central portion of the display device 1000 in a plan view defined by the first direction D1 and the second direction D2. The light shielding portion WA may be disposed around the light transmitting portion TA and may have a frame shape surrounding the light transmitting portion TA.

A display area DA at which an image is displayed and a non-display area NDA at which the image is not displayed may be defined for the display panel 400 in the plan view. The display area DA may be defined at a central portion of the display panel 400 to overlap with the light transmitting portion TA of the window member 100 in the plan view. Referring to FIG. 1A, the non-display area NDA may extend from the display area DA, along a direction parallel to the second direction D2, to the distal end of the display device 1000 at the driving circuit CC.

The anti-reflection unit 200 may be disposed on the display panel 400 and under the window member 100. The anti-reflection unit 200 may include a color filter, a polarizing film and/or a phase retardation film. The polarizing film may polarize light provided from the display panel 400. When the anti-reflection unit 200 includes the phase retardation film, a number of individual films within the phase retardation film and a phase retardation length of the phase retardation films may be determined depending on an operating principle of the anti-reflection unit 200.

The input sensing unit 300 may be disposed on the display panel 400 and under the anti-reflection unit 200. The input sensing unit 300 may sense and determine coordinate information of an external input thereto from outside the display device 1000. The input sensing unit 300 may sense at least one of various kinds of inputs provided from the outside of the display device 1000. In an exemplary embodiment, for example, the input sensing unit 300 may sense an input provided by a body (e.g., a finger) of a user and/or may sense or recognize at least one of other various external inputs such as light, heat and pressure. In addition, the input sensing unit 300 may sense a proximity input which is applied close to but not necessarily contacting a sensing surface as well as a direct input which comes into contact with the sensing surface.

In the present embodiment, the anti-reflection unit 200 and the input sensing unit 300 are provided individually as separate members. However, in another embodiment, at least one of the anti-reflection unit 200 and the input sensing unit 300 may be omitted from the display device 1000.

Alternatively, at least one of the anti-reflection unit 200 and the input sensing unit 300 may be disposed or formed directly on the display panel 400 such as through a deposition process, etc. In such case, the display panel 400 may be considered as including therein an anti-reflection layer and/or an input sensing unit layer.

The display panel 400 may be disposed under the window member 100. The display panel 400 may be a flexible display panel, e.g., an organic light emitting display panel. The display panel 400 may include the display area DA in which a pixel PX is disposed, and the non-display area NDA which is adjacent to the display area DA. The pixel PX may be provided in plurality within the display area DA. The pixels PX may not be disposed in the non-display area NDA, but peripheral components such as (conductive) signal, control and/or power lines and banks may be disposed in the non-display area NDA. The display area DA and the non-display area NDA may correspond to the light transmitting portion TA and the light shielding portion WA of the window member 100, respectively. However, shapes and/or planar areas (sizes) of the above-described areas and the portions corresponding to each other may not be completely the same as each other.

FIG. 1B illustrates an equivalent circuit of an embodiment of a pixel PX disposed in the display area DA. The pixel PX may be used to control light transmittance and/or generate an image which is displayed in the display area DA. The pixel PX may receive a gate signal from a gate line GL and may receive a data signal from a data line DL. In addition, the pixel PX may receive a first power source voltage ELVDD from a power line KL. The pixel PX may include switching elements therein such as a first thin film element TFT1, a second thin film element TFT2, a capacitor Cap, and an organic light emitting element OLED.

The first thin film element TFT1 may output the data signal provided from the data line DL, in response to the gate signal provided from the gate line GL. The capacitor Cap may be charged with a voltage corresponding to the data signal received from the first thin film element TFT1.

The second thin film element TFT2 may be connected to the organic light emitting element OLED. The second thin film element TFT2 may control a driving (electrical) current flowing through the organic light emitting element OLED, in response to the amount of charges stored in the capacitor Cap.

The organic light emitting element OLED may include a first electrode (not shown) connected to the second thin film element TFT2 and a second electrode (not shown) receiving a second power source voltage ELVSS. A level of the second power source voltage ELVSS may be lower than a level of the first power source voltage ELVDD.

In addition, the organic light emitting element OLED may include an organic light emitting layer disposed between the first electrode and the second electrode. The organic light emitting element OLED may generate and emit light while the second thin film element TFT2 is turned-on. However, the configuration of the pixel PX is not limited to FIG. 1B but may be variously modified.

As illustrated in FIGS. 2A and 2B, the display panel 400 may include a base layer SUB, a circuit layer CK and a display element layer PL. The circuit layer CK may include the first thin film element TFT1, the second thin film element TFT2, the capacitor Cap, and insulating layers ILL IL2 and IL3. The display element layer PL may include a pixel defining layer PDL and the layers forming the organic light emitting element OLED. In an embodiment, the circuit layer CK and/or the display element layer PL disposed in the display area DA may terminate at the non-display area NDA. In an embodiment, portions of the circuit layer CK and/or the display element layer PL disposed in the display area DA may terminate at the non-display area NDA or may be extended from the display area DA into the non-display area NDA.

The base layer SUB may include at least one of a glass substrate, a metal substrate and a flexible plastic substrate. A semiconductor pattern AL1 (hereinafter, referred to as 'a first semiconductor pattern') of the first thin film element TFT1, a semiconductor pattern AL2 (hereinafter, referred to as 'a second semiconductor pattern') of the second thin film element TFT2, and a first insulating layer IL1 may be disposed on the base layer SUB. The first insulating layer IL1 may cover the first semiconductor pattern AL1 and the second semiconductor pattern AL2. A first electrode CE1 of the capacitor Cap may be disposed on the first insulating layer IL1.

A control electrode GE1 (hereinafter, referred to as 'a first control electrode') of the first thin film element TFT1, a control electrode GE2 (hereinafter, referred to as 'a second control electrode') of the second thin film element TFT2, and a second insulating layer IL2 may be disposed on the first insulating layer ILL The second insulating layer IL2 may cover the first control electrode GE1 and the second control electrode GE2. The first and second control electrodes may be a portion of the gate line GL, without being limited thereto. The first electrode CE1, the control electrodes and the gate line GL may be in a same one layer of the display panel 400 among layers on the base layer SUB. In a method of manufacturing a display device, first electrode CE1, the control electrodes and the gate line GL may be formed from a same material layer.

Each of the first and second insulating layers IL1 and IL2 may include an organic layer and/or an inorganic layer. Each of the first and second insulating layers IL1 and IL2 may include a plurality of relatively thin layers.

An input electrode SE1 and an output electrode DE1 of the first thin film element TFT1, an input electrode SE2 and an output electrode DE2 of the second thin film element TFT2, and a third insulating layer IL3 may be disposed on the second insulating layer IL2. Hereinafter, the input electrode SE1 and the output electrode DE1 of the first thin film element TFT1 are referred to as a first input electrode SE1 and a first output electrode DE1, respectively, and the input electrode SE2 and the output electrode DE2 of the second thin film element TFT2 are referred to as a second input electrode SE2 and a second output electrode DE2, respectively.

A second electrode CE2 of the capacitor Cap may be disposed on the second insulating layer IL2. The third insulating layer IL3 may cover the first input electrode SE1, the first output electrode DE1, the second input electrode SE2, the second output electrode DE2 and the second electrode CE2. The second electrode CE2, the input electrodes and the output electrodes may be in a same one layer of the display panel 400 among layers on the base layer SUB. In a method of manufacturing a display device, the second electrode CE2, the input electrodes and the output electrodes may be formed from a same material layer.

The first input electrode SE1 and the first output electrode DE1 may be connected to portions of the first semiconductor pattern AL1 at and through a first through-hole CH1 and a second through-hole CH2 penetrating the second and third insulating layers IL2 and IL3, respectively. Likewise, the second input electrode SE2 and the second output electrode DE2 may be connected to portions of the second semiconductor pattern AL2 at and through a third through-hole CH3 and a fourth through-hole CH4 penetrating the second and third insulating layers IL2 and IL3, respectively.

The organic light emitting element OLED and the pixel defining layer PDL may be disposed on the third insulating layer IL3. The pixel defining layer PDL may have or define an opening OP overlapping with the organic light emitting element OLED. The opening OP of the pixel defining layer PDL may substantially define a light emitting area of the pixel PX at which light is emitted to display an image. A remainder of pixel PX may be a non-light-emitting area at which light is not emitted such that the image is not displayed, without being limited thereto.

The organic light emitting element OLED may include an anode electrode AE, an emission pattern EML, a cathode electrode CE, a hole transfer region CL1 (or a first common layer) disposed between the anode electrode AE and the emission pattern EML, and an electron transfer region CL2 disposed between the emission pattern EML and the cathode electrode CE. The anode electrode AE may be disposed on the third insulating layer IL3. The anode electrode AE may be provided in plurality, and the plurality of anode electrodes AE may overlap with a plurality of the light emitting areas at a plurality of openings OP, respectively. The pixel defining layer PDL may be disposed on the anode electrode AE, and the opening OP of the pixel defining layer PDL may expose at least a portion of the anode electrode AE. The anode electrode AE may be connected to the second output electrode DE2 at and through a fifth through-hole CH5 defined in the third insulating layer IL3.

The hole transfer region CL1 may be disposed on the anode electrode AE and may cover the anode electrode AE and the pixel defining layer PDL. At least a portion of the hole transfer region CL1 may be disposed in the opening OP. The hole transfer region CL1 may include at least one of a hole injection layer, a hole transfer layer, and a single layer having both a hole injection function and a hole transfer function.

The emission pattern EML may be disposed on the hole transfer region CL1 and may be disposed in the opening OP. The emission pattern EML may be provided in plurality, and the plurality of emission patterns EML may overlap with the light emitting areas at the plurality of openings OP, respectively. The emission pattern EML may include a fluorescent material or a phosphorescent material. The emission pattern EML may generate light having one of a red color, a green color and a blue color or may generate light having a mixed color of at least two colors. The emission pattern EML may correspond to the organic light emitting layer described with reference to FIG. 1B.

The electron transfer region CL2 may be disposed on the emission pattern EML to cover the emission pattern EML and the hole transfer region CL1. The electron transfer region CL2 may include at least one of an electron transfer material and an electron injection material. The electron transfer region CL2 may be an electron transfer layer including the electron transfer material or may be an electron injection/transfer single layer including the electron injection material and the electron transfer material.

The cathode electrode CE may be disposed on the electron transfer region CL2 and may be opposite to the anode electrode AE. The cathode electrode CE may include or be formed of a material having a relatively low work function to easily inject electrons.

Materials of the cathode and anode electrodes CE and AE may be determined depending on a light emitting type of the display panel 400. In an embodiment, for example, when the display panel 400 according to the invention is a front surface light emitting type, the cathode electrode CE may be a transmissive electrode and the anode electrode AE may be a reflective electrode.

Alternatively, for another embodiment, when the display panel 400 according to the invention is a rear surface light emitting type, the cathode electrode CE may be a reflective electrode and the anode electrode AE may be a transmissive electrode. The display area DA according to the invention may include at least organic light emitting element among organic light emitting elements having various structures, and the invention is not limited to one embodiment.

A thin film encapsulation layer TFE may be disposed on the cathode electrode CE. The thin film encapsulation layer TFE may cover an entire top surface of the cathode electrode CE and may encapsulate the organic light emitting element OLED on the base layer SUB.

The thin film encapsulation layer TFE may have a cross-sectional thickness of about 1 micrometer ($\mu$m) to about 10 micrometers ($\mu$m). Since the display panel 400 includes the thin film encapsulation layer TFE, the display panel 400 having a relatively small overall thickness may be realized.

The thin film encapsulation layer TFE may include a plurality of inorganic layers. Each of the inorganic layers may include at least one of silicon nitride and silicon oxide. In addition, the thin film encapsulation layer TFE may further include another functional layer disposed between the inorganic layers.

Referring again to FIG. 1A, a driving circuit CC may be mounted on the display panel 400, such as at a non-display area thereof. Even though not shown in the drawings, the driving circuit CC may be electrically connected to the circuit layer CK and/or the display element layer PL which are disposed in the display area DA of the display panel 500. In an embodiment, the driving circuit CC may be electrically connected to the circuit layer CK and the display element layer PL through a plurality of signal lines disposed in the display panel 400. The signal lines may include at least one of the gate line GL, the data line DL and the power line KL and may include other various conductive lines for providing electrical signals to the pixel PX.

The driving circuit CC may include a gate driver and/or a data driver. The gate driver may output gate signals to the gate line GL provided in plurality, in response to a control signal. The data driver may receive control signals and image data outputted from a signal controller. The data driver may convert the image data into data voltages and may provide the data voltages to the data line DL provided in plurality.

A pad portion may be defined at one edge or end of the display panel 400 in the second direction D2. The pad portion may include a (terminal) pad of the display panel 400 which are provided in plurality arranged in the first direction D1. The pads of the display panel 400 at the pad portion may be connected to display area DA elements such as the pixels PX of the display panel 400.

Even though not shown in the drawings, the pad portion of the display panel 400 may be in contact with a flexible printed circuit board to electrically connect the display panel 400 to the flexible printed circuit board. A controller may be mounted on the flexible printed circuit board. The controller may receive various kinds of control signals and may output signals required to start operations of the data driver or gate driver. The control signals may be provided to the display panel 400 via the flexible printed circuit board. However, embodiments of the invention are not limited thereto. In other embodiments, various driving elements may be mounted on the flexible printed circuit board.

The support member 500 may be disposed under the display panel 400. The support member 500 may include a first bump BP1 and a second bump BP2. The first bump BP1 and the second bump BP2 may be arranged in the second direction D2. A size of the second bump BP2 may be greater than a size of the first bump BP1. Structures of the bumps BP1 and BP2 will be described later in detail with reference to FIGS. 3A and 3B.

The support member 500 may include a plastic film as a base layer. The support member 500 may include a plastic film including a thermoplastic resin, for example, one selected from polyethylene terephthalate ("PET"), polyethylene ("PE"), polyvinylchloride ("PVC"), polypropylene ("PP"), polystyrene ("PS"), polyacrylonitrile ("PAN"), styrene-acrylonitrile copolymer ("SAN"), acrylonitrile-butadiene-styrene ("ABS"), polymethyl methacrylate ("PMMA"), and any combination thereof. In particular, the support member 500 according to an embodiment of the invention may use polyethylene terephthalate ("PET"). In this case, the support member 500 may have excellent heat resistance, excellent fatigue strength, and excellent electrical characteristics and may be less affected by temperature and humidity than other materials.

The material of the support member 500 is not limited to the plastic resins but may include an organic/inorganic composite material. In an embodiment, for example, the support member 500 may include a porous organic layer and an inorganic material which fills pores of the porous organic layer.

The protective film 600 may be disposed under the support member 500. The protective film 600 may have a heat dissipation function of dissipating heat generated from the display panel 400 to outside thereof or outside the display device. In addition, the protective film 600 may include or be formed of a functional layer supporting structures disposed under the display panel 400. The protective film 600 may include or be formed of a plastic material such as polycarbonate ("PC"), polyimide ("PI"), polyethylene naphthalate ("PEN"), polyethylene terephthalate ("PET"), at least one of other suitable polymers, or any combination thereof. The strength of the protective film 600 including or formed of at least one of these plastic materials may be controlled or adjusted by adjusting a thickness of the protective film 600 and/or by providing an additive for increasing the strength. However, embodiments of the invention are not limited thereto. In other embodiments, the protective film 600 may include or be formed of glass, ceramic, metal, other rigid materials, or any combination thereof.

Figure 3A:
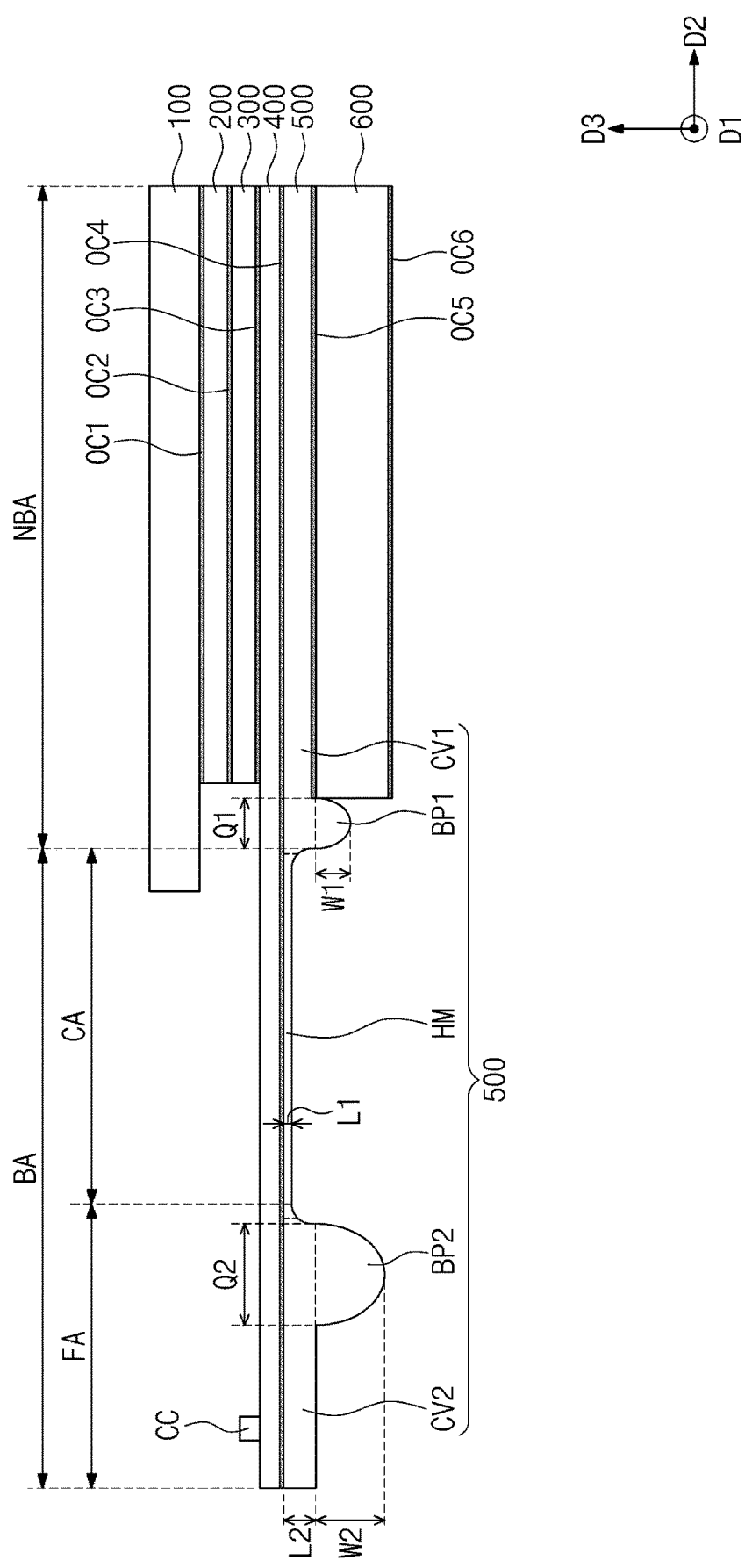
FIG. 3A is a cross-sectional view illustrating another embodiment of a display device according to the invention.
Figure 3B:
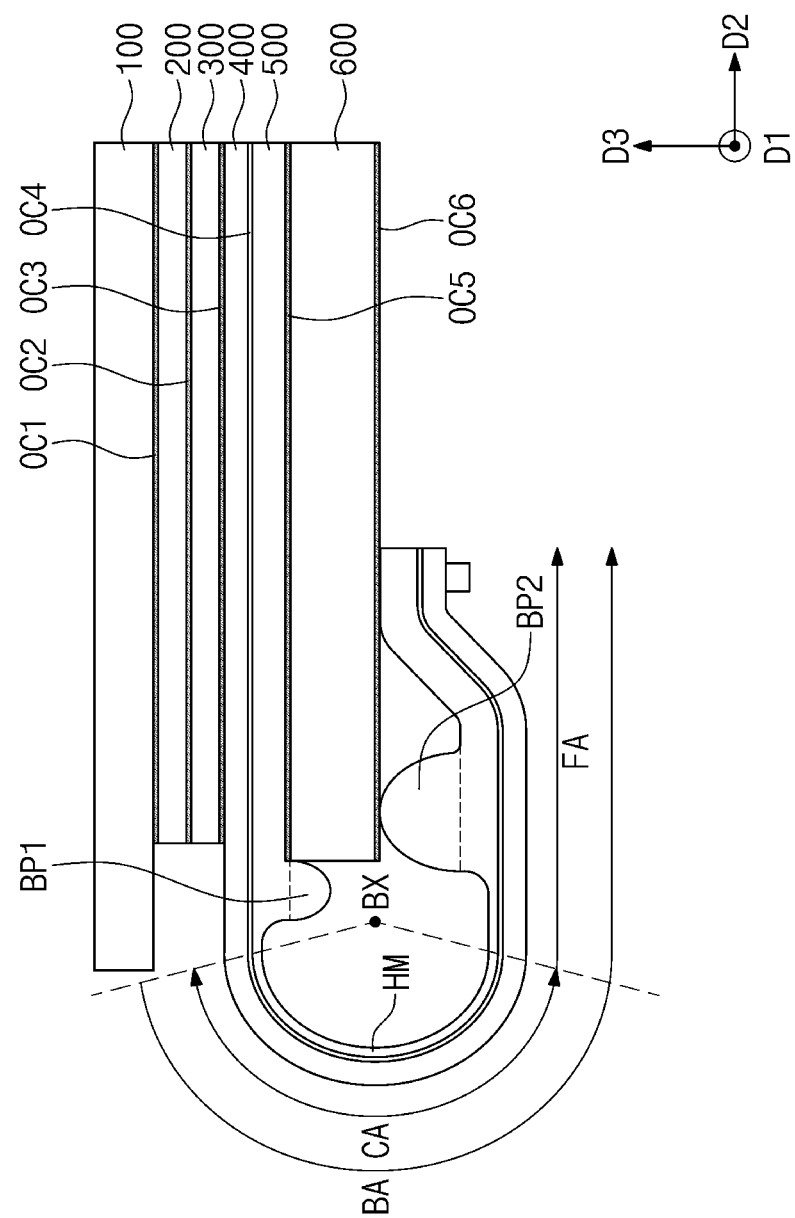
FIG. 3B is a cross-sectional view illustrating an embodiment of the display device of FIG. 3A in a bent state, according to the invention.

FIG. 3A is a cross-sectional view illustrating an embodiment of a display device according to the invention. FIG. 3B is a cross-sectional view illustrating the display device of FIG. 3A in a bent state, according to the invention. FIGS. 3A and 3B are cross-sectional views of the display device 1000, which are taken along the second direction D2 of FIG. 1. The structures illustrated in FIGS. 3A and 3B are disposed at an end (or edge) portion of a display device at which a portion thereof is bendable from a flat state (FIG. 3A) to the bent state (FIG. 3B).

As illustrated in FIG. 3A, the display device 1000 may be divided into a bending area BA at which the display device 1000 is bent and a non-bending area NBA at which the display device 1000 is not bent and an image is displayed. The bending area BA may include a curvature area CA and a facing area FA. The curvature area CA and the facing area FA together may define an entirety of the bending area BA. The curvature area CA may have a predetermined curvature in a state in which the display device 1000 is bent, and the facing area FA may face at least a portion of the non-bending area NBA in the state in which the display device 1000 is bent. The circuit layer CK of the display panel 400 may be extended to be disposed in both the bending area BA and the non-bending area NBA.

Referring to FIG. 3A, the non-display area NDA (FIG. 1A) along a direction parallel to the second direction D2 includes at least the bending area BA of the flat state display device 1000, and the display area DA (FIG. 1A) includes at least a portion of the non-bending NBA. In embodiments relating to FIG. 3A, the non-display area NDA may be defined as extending to a distal end of the display device 1000 along the direction parallel to the second direction D2, from a position such as at an edge of the input sensing unit 300, an edge of the antireflection film 200, an edge of the window member 100 or an edge of the non-bending area NBA, without limitation. In an embodiment, the first bump BP1 and the second bump BP2 may each be disposed in the non-display area NDA, or the non-display area NDA may be considered as excluding the first bump BP1 to be considered disposed adjacent to the first bump BP1. In the latter, a boundary between the non-bending area NBA and the bending area BA in FIG. 3A may be considered as defining a boundary between the display area DA and the non-display area NDA (FIG. 1A) for the flat display device 1000 from which a curved display device 1000 (FIG. 3B) will be formed.

The support member 500 may be disposed under the display panel 400. The support member 500 may include or define a recessed portion HM, the first bump BP1, the second bump BP2 and extensions CV1 and CV2, which are arranged in the second direction D2.

The recessed portion HM may be disposed to correspond to the curvature area CA of the bending area BA. The first bump BP1 and a first extension CV1 which extends from the first bump BP1 may be disposed to correspond to the non-bending area NBA. The second bump BP2 and a second extension CV2 which extends from the second bump BP2 to an end of the support member 500 may be disposed to correspond to the facing area FA of the bending area BA. The first bump BP1 and the second bump BP2 may be spaced apart from each other with the recessed portion HM interposed therebetween. The first extension CV1 may extend from the first bump BP1 in the second direction D2 and may be disposed to correspond to the display element layer PL of the display panel 400. The second extension CV2 may extend from the second bump BP2 in parallel to the second direction D2 and may be disposed adjacent to the driving circuit CC at an end of the display panel 400 corresponding to the end of the support member 500.

The first bump BP1 may be adjacent to the display element layer PL of the display panel 400 and may be disposed in the non-bending area NBA. The second bump BP2 may be disposed in the facing area FA of the bending area BA. The first bump BP1 and the second bump BP2 may protrude from the first extension CV1 and the second extension CV2 in parallel to the third direction D3, respectively, and thus each of the first and second bumps BP1 and BP2 may have a predetermined height.

The size of the first bump BP1 closer to the non-bending area NBA than the second bump BP2 may be different from the size of the second bump BP2 in a cross-sectional view. A thickness in the third direction D3 of the first and second extensions CV1 and CV2 may define a base portion of the support member 500 from which a height of a bump is determined. The first and second extensions CV1 and CV2 may define a same thickness as each other. The maximum height W1 of the first bump BP1 from the first extension CV1 in the third direction D3 may be less than the maximum height W2 of the second bump BP2 from the second extension CV2 in the third direction D3.

In addition, the maximum width Q1 of the first bump BP1 in the second direction D2 from the first extension CV1 to the recessed portion HM may be less than the maximum width Q2 of the second bump BP2 in the second direction D2 from the second extension CV2 to the recessed portion HM. The minimum thickness L2 of the extensions CV1 and CV2 in the third direction D3 may be greater than the maximum thickness L1 of the recessed portion HM in the third direction D3 in the cross-sectional view.

As illustrated in FIG. 3B, the display device 1000 may be bent with reference to a bending axis BX such that the bending area BA has a predetermined curvature. In the present embodiment, the display device 1000 may be bent with reference to the bending axis BX extending parallel to the first direction D1. The display panel 400 and the support member 500 may each be bend with reference to the bending axis BX. The curvature area CA of the bending area BA may substantially correspond to the recessed portion HM. The second extension CV2 disposed in the facing area FA may have a bent shape and may be adhered to a bottom of the protective film 600. Since the first bump BP1 is disposed in the non-bending area NBA, the first bump BP1 may not be affected by tensile force generated in the bent state of the display device 1000. In addition, since the second bump BP2 is disposed in the facing area FA of the bending area BA, the second bump BP2 may be less affected by the tensile force generated in the bent state than the curvature area CA (e.g., the recessed portion HM).

In the state in which the display device 1000 is bent with reference to the bending axis BX, at least a portion of each of the second bump BP2 and the second extension CV2 disposed in the facing area FA may be in contact with the bottom of the protective film 600. In more detail, at least a portion of each of the second bump BP2 and the second extension CV2 may be in contact with an adhesive OC6 disposed under the protective film 600.

The display device 1000 may include adhesive layers OC1, OC2, OC3, OC4 and OC5 disposed between different layers (or different components) so as to attach the different layers to each other, respectively. Each of the adhesive layers OC1, OC2, OC3, OC4 and 005 may include a pressure sensitive adhesive ("PSA"), an optical clear adhesive ("OCA"), an optical clear resin ("OCR"), a foam-type adhesive, a liquid adhesive, a photo-curable adhesive, a thermosetting adhesive, or another suitable adhesive.

In some embodiments, each of the adhesive layers OC1 to OC5 may include or be formed of a compression material or may include the compression material. The adhesive layers OC1 to OC5 may act as cushions for the components respectively coupled by the adhesive layers OC1 to OC5. In an embodiment, for example, the materials of the adhesive layers OC1 to OC5 may be compressible. In an embodiment, one or some of the adhesive layers OC1 to OC5 may be omitted. Even though not shown in the drawings, a resin (not shown) may be applied to exposed (distal) ends of the second extension CV2 and the display panel 400 which are furthest from the bending area BA, in the bent state of the display device 1000. With the resin applied as described above, inhibiting or effectively preventing external moisture and impurities from permeating into the display device 1000 is possible.

Referring to FIG. 3B, the non-display area NDA along a direction parallel to the second direction D2 may be defined as extending to a distal end of the display device 1000 at the bending area BA from a position such as at an edge of the input sensing unit 300, an edge of the antireflection film 200, an edge of the window member 100 or an edge of the non-bending area NBA, without limitation. In an embodiment, the first bump BP1 may be disposed in the non-display area NDA, or the non-display area NDA may be considered as excluding the first bump BP1 to be considered disposed adjacent to the first bump BP1. In the latter, an edge of the first bump BP1 furthest in the direction opposite to the second direction D2 may be considered as defining a boundary between the display area DA and the non-display area NDA (FIG. 1A) for the curved display device 1000 (FIG. 3B) formed from a flat display device 1000 (FIG. 3B).

According to the embodiment of the invention, the first bump BP1 may be adjacent to the display element layer PL (see FIGS. 2A and 2B) and may be disposed in the non-bending area NBA. In addition, the size of the first bump BP1 may be less than the size of the second bump BP2, and the second bump BP2 may be disposed to overlap with at least a portion of the bottom of the protective film 600 in the bent state.

Since the first bump BP1 is disposed adjacent to the display element layer PL, minimizing stress which may occur at the first bump BP1 when bending the display device 1000 is possible. In addition, since the size of the first bump BP1 is less than the size of the second bump BP2, reducing the non-display area NDA of the display panel 400, which is adjacent to the first bump BP1, is possible. A bezel of the curved display device 1000 in FIG. 3B may correspond to the non-display area NDA which is adjacent to the first bump BP1 and extends along the direction parallel to the second direction D2 to the distal end of the curved display device 1000. Thus, interference between the bumps BP1 and BP2 may be minimized, and an additional undesired space formed by the bump may be reduced or minimized. In addition, the second bump BP2 may be in contact with the bottom of the protective film 600 in the bent state of the display device 1000, and thus the second bump BP2 may act as a spacer to improve overall mechanical strength of the display device 1000.

Figure 4A:
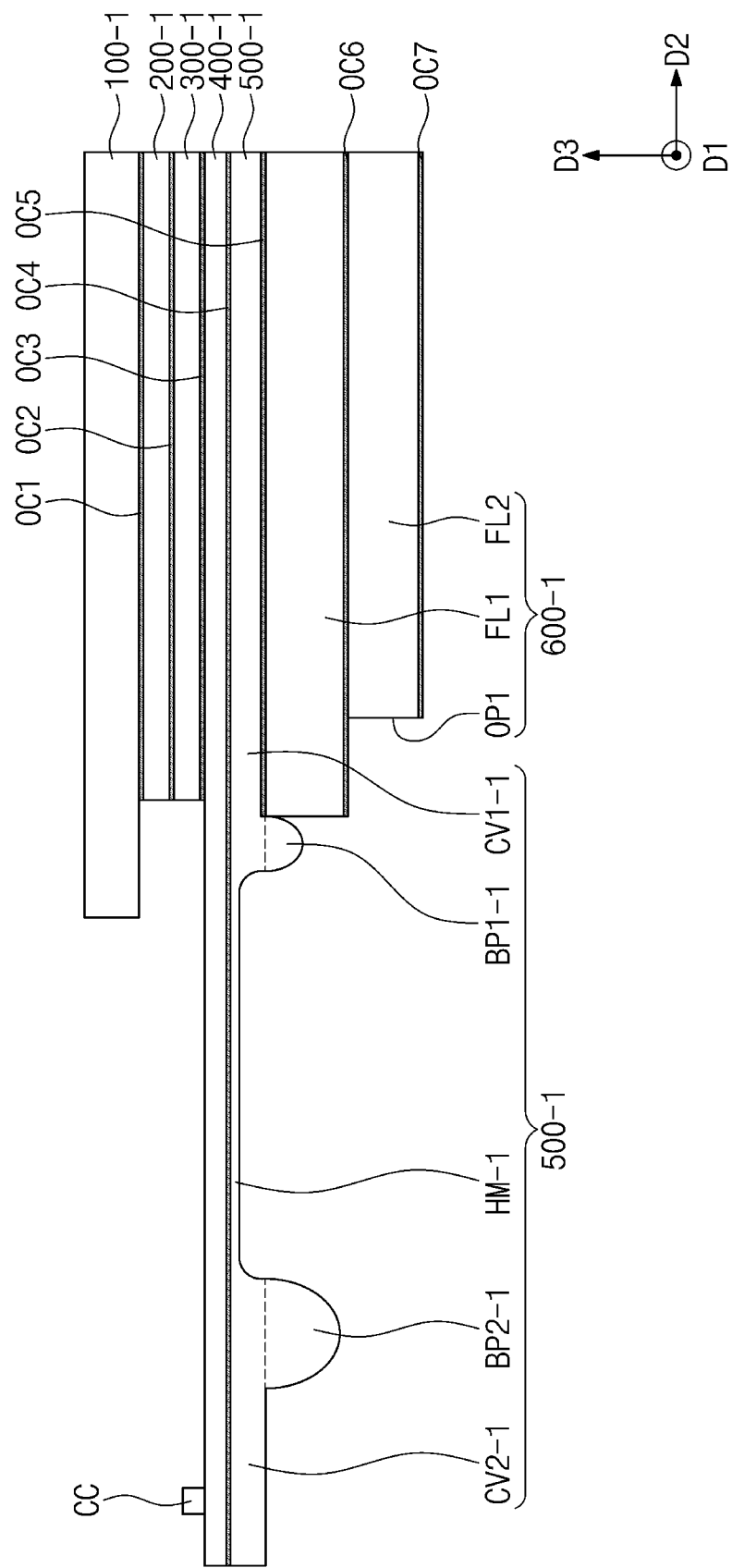
FIG. 4A is a cross-sectional view illustrating another embodiment of a display device according to the invention.
Figure 4B:
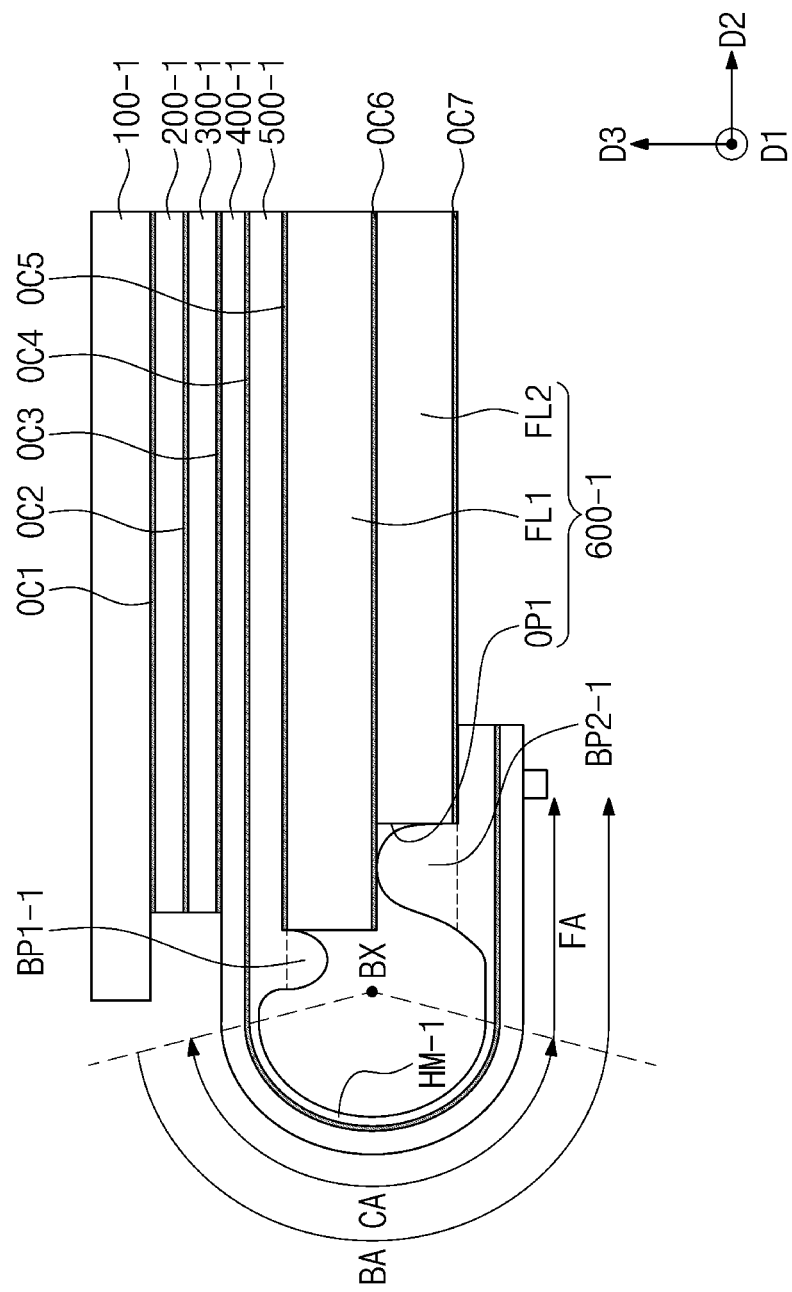
FIG. 4B is a cross-sectional view illustrating an embodiment of the display device of FIG. 4A in a bent state, according to the invention.

FIG. 4A is a cross-sectional view illustrating another embodiment of a display device according to the invention. FIG. 4B is a cross-sectional view illustrating the display device of FIG. 4A in a bent state, according to the invention. In the present embodiment, similar reference numerals or designators to those of FIGS. 3A and 3B will be used and the descriptions to the same technical features as in the embodiment of FIGS. 3A and 3B will be omitted. A window member 100-1, an anti-reflection unit 200-1, an input sensing unit 300-1 and a display panel 400-1 have the same configurations as described above for the embodiment of FIGS. 3A and 3B and repeated descriptions will be omitted.

As illustrated in FIG. 4A, a protective film 600-1 may include a first film FL1 and a second film FL2. The protective film 600-1 may be disposed under an extension CV1-1 of a support member 500-1. The first film FL1 may overlap with at least a portion of a first bump BP1-1 in the second direction D2 and may be coupled to an adhesive layer OC5 disposed under the extension CV1-1.

The second film FL2 may be disposed to expose at least a portion of the first film FL1 and may have a stepped region OP1 defined by the first film FL1 extending further than an end surface of the second film FL2. In detail, the second film FL2 may be coupled to an adhesive OC6 disposed under the first film FL1.

As illustrated in FIG. 4B, in the state in which the display device 1000 is bent with reference to the bending axis BX, at least a portion of a second bump BP2-1 may be disposed to be in contact with an inner surface of the stepped region OP1. In more detail, the second bump BP2-1 may be in contact with at least a portion of the adhesive OC6 exposed by the second film FL2 and a side surface of the second film FL2 substantially perpendicular to the adhesive OC6. The extension CV2-1 may be in contact with the adhesive OC7 at a bottom surface of the second film FL2. The first bump BP1-1 and the second bump BP2-1 may be spaced apart from each other with the recessed portion HM-1 interposed therebetween.

However, this is described as an example. In the present embodiment, the protective film 600-1 may consist of a plurality of layers, and the second bump BP2-1 of the display device 1000 in the bent state may be disposed to be in contact with the inner surface of the stepped region of the plurality of layers.

Figure 5A:
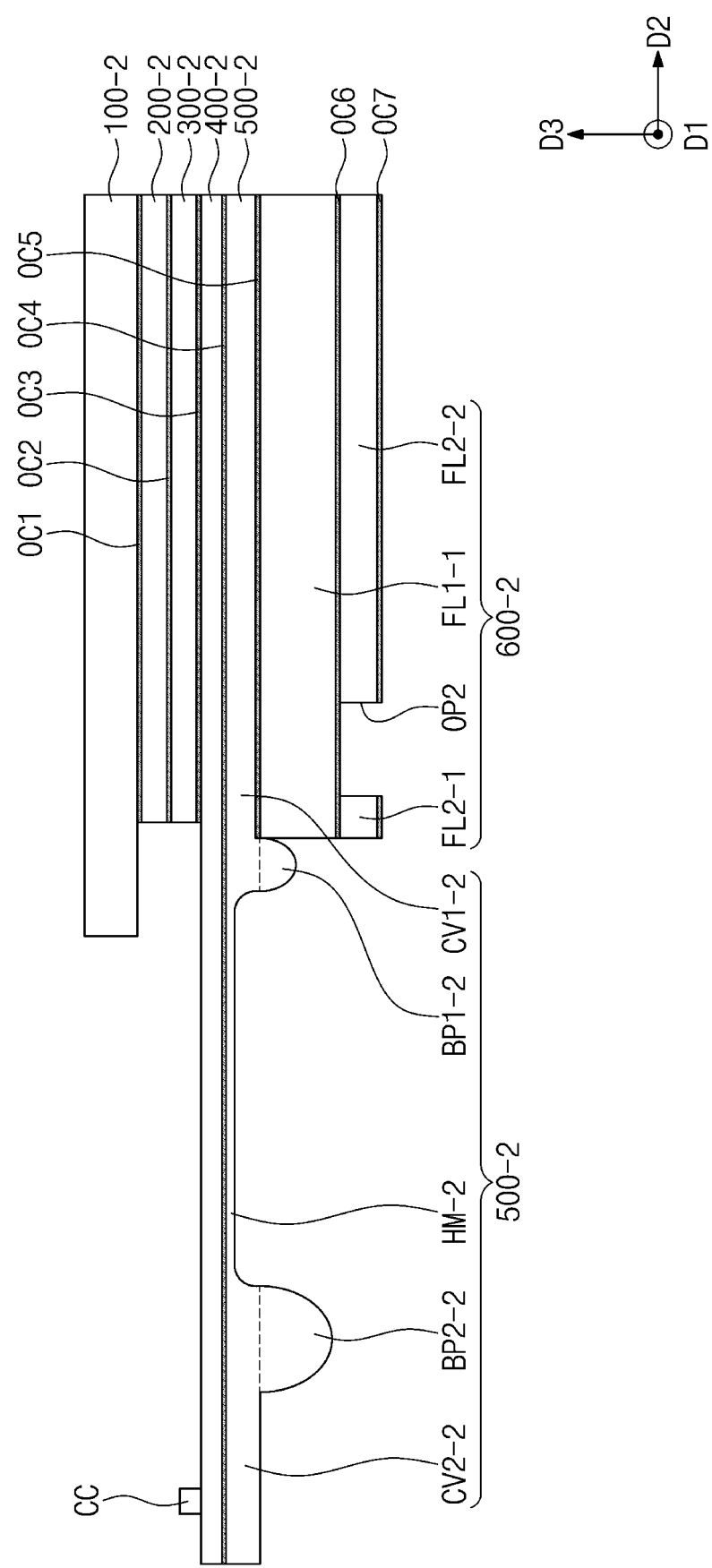
FIG. 5A is a cross-sectional view illustrating still another embodiment of a display device according to the invention.
Figure 5B:
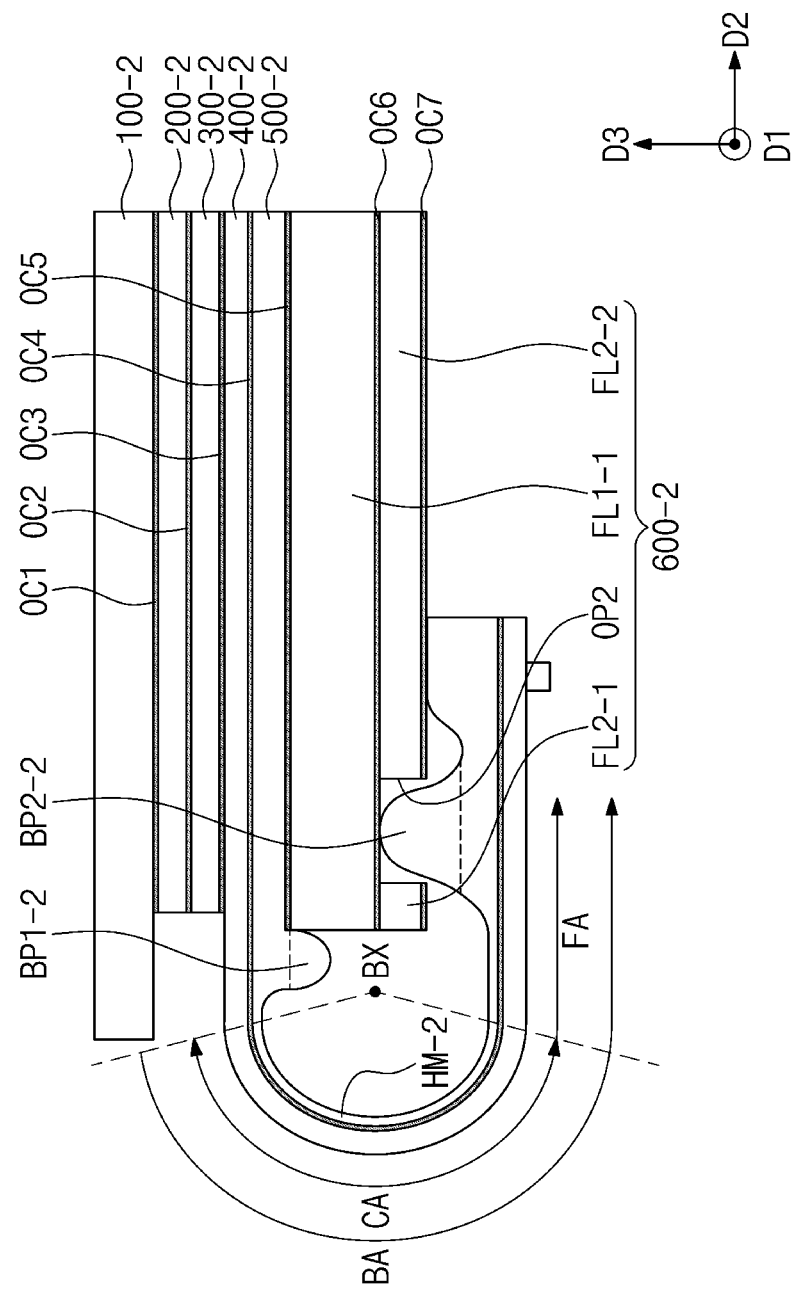
FIG. 5B is a cross-sectional view illustrating an embodiment of the display device of FIG. 5A in a bent state, according to the invention.

FIG. 5A is a cross-sectional view illustrating still another embodiment of a display device according to the invention. FIG. 5B is a cross-sectional view illustrating the display device of FIG. 5A in a bent state, according to the invention. In the present embodiment, similar reference numerals or designators to those of FIGS. 3A and 3B will be used and the descriptions to the same technical features as in the embodiment of FIGS. 3A and 3B will be omitted. A window member 100-2, an anti-reflection unit 200-2, an input sensing unit 300-2 and a display panel 400-2 have the same configurations as described above for the embodiment of FIGS. 3A and 3B and repeated descriptions will be omitted.

As illustrated in FIG. 5A, a protective film 600-2 may include a first film FL1-1 and a second film. The protective film 600-2 may be disposed under an extension CV1-2 of a support member 500-2. The first film FL1-1 may overlap with at least a portion of a first bump BP1-2 in the second direction D2 and may be coupled to an adhesive layer OC5 disposed under an extension CV1-2.

The second film may collectively include a first portion FL2-1, an opening OP2 and a second portion FL2-2 which are sequentially arranged in the second direction D2. Here, the first portion FL2-1 of the second film may be adjacent to the first bump BP2-1. A width of the first portion FL2-1 in the second direction D2 may be less than a width of the second portion FL2-2 in the second direction D2.

The opening OP2 may expose at least a portion of the first film FL1-1 and may be defined by and disposed between the first portion FL2-1 and the second portion FL2-2. When the display device 1000 is bent (FIG. 5B), at least a portion of a second bump BP2-2 may be coupled to the opening OP2. In more detail, at least a portion of the second bump BP2-2 may be coupled to an adhesive OC6 exposed by the opening OP2 at side surfaces of the first and second portions FL2-1 and FL2-2 defining the opening OP2. The extension CV2-2 may be in contact with the adhesive OC7 at a bottom surface of the second portion FL2-2. The first bump BP1-2 and the second bump BP2-2 may be spaced apart from each other with the recessed portion HM-2 interposed therebetween.

According the embodiments of the invention, at least a portion of the second bump BP2-2 of the display device 1000 bent with reference to the bending axis BX may be disposed to overlap with the stepped region OP1 (see FIGS. 4A and 4B) or the opening OP2 (FIGS. 5A and 5B) and may be coupled to at least a portion of the side surface of the second film. Thus, an overall thickness of the display device 1000 in the third direction D3 (e.g., a thickness direction) may be reduced. In addition, since the second bump BP2-1 and BP2-2 having the spacer function is respectively disposed in the stepped region OP1 and the opening OP2, the overall mechanical strength of the display device 1000 may be improved or increased.

Figure 6A:
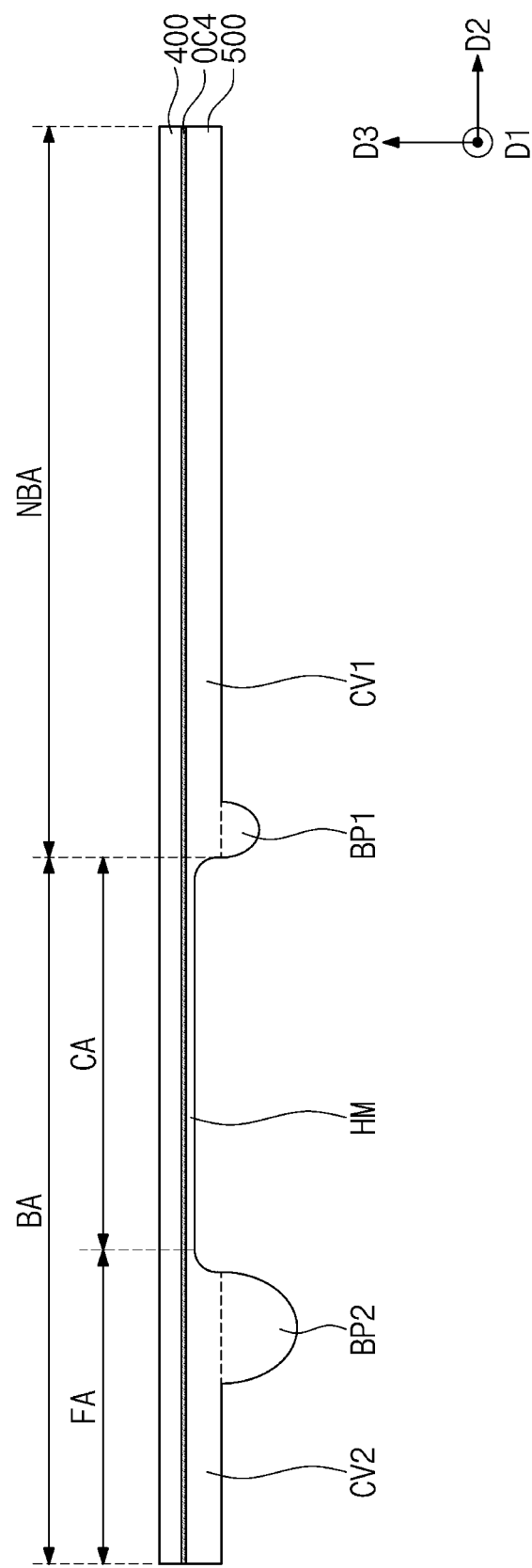
FIG. 6A is a cross-sectional view illustrating a portion of a display device according to an embodiment of the invention.
Figure 6B:
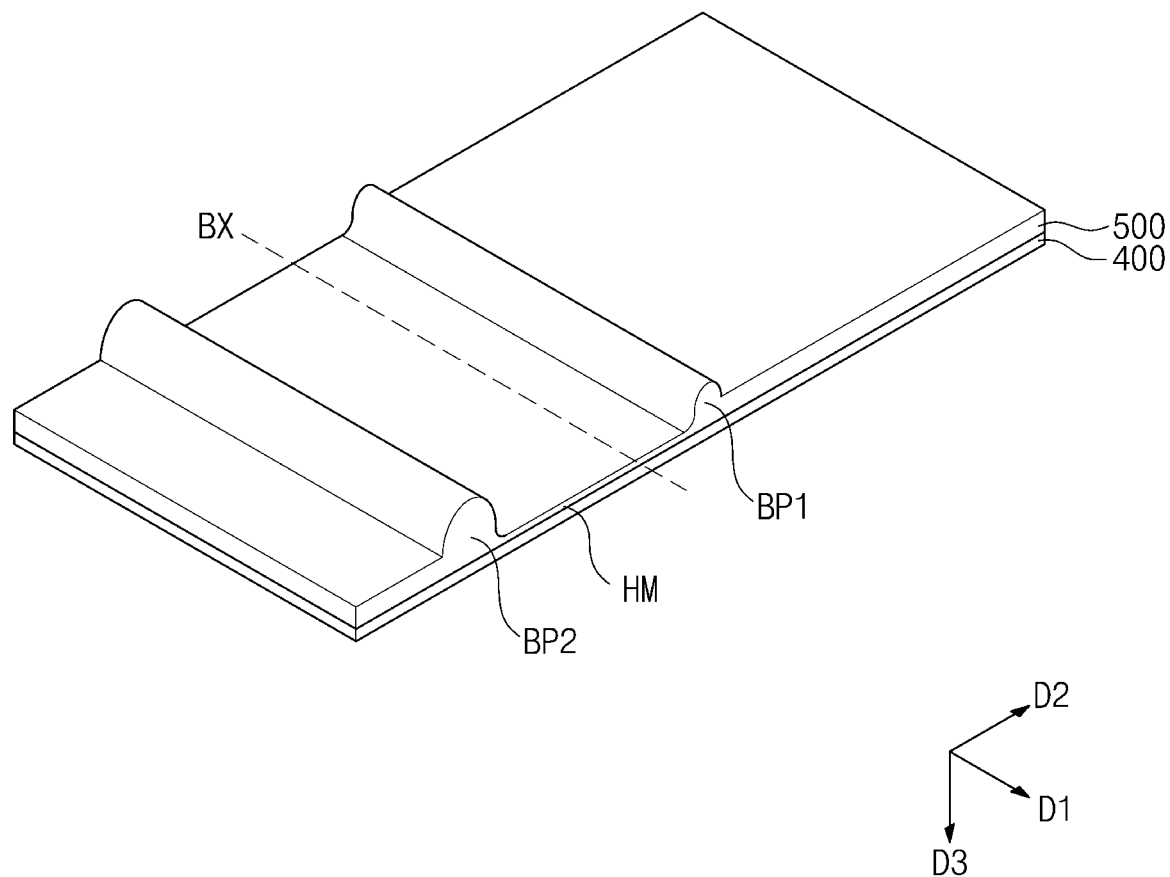
FIG. 6B is a perspective view illustrating the portion of the display device in FIG. 6A, according to the invention.

FIG. 6A is a cross-sectional view illustrating yet another embodiment of a portion of a display device according to the invention. FIG. 6B is a perspective view illustrating a portion of the display device of FIG. 6A according to the invention. In the present embodiment, similar reference numerals or designators to those of FIGS. 3A and 3B will be used and the descriptions to the same technical features as in the embodiment of FIGS. 3A and 3B will be omitted.

FIG. 6A illustrates some components of the display device 1000 described in previous embodiments, and remaining components are omitted for convenience of illustration. The support member 500 may be disposed under the display panel 400. In detail, the support member 500 may be coupled to the adhesive layer OC4 disposed under the display panel 400. The support member 500 may include the recessed portion HM, the first bump BP1 and the second bump BP2 spaced apart from each other in the second direction D2 with the recessed portion HM interposed therebetween, and the extensions CV1 and CV2 extending from the first and second bumps BP1 and BP2, respectively. The recessed portion HM, the first bump BP1, the second bump BP2 and the extensions CV1 and CV2 may define an entirety of the support member 500.

The first bump BP1 may be closer to the display element layer PL (see FIG. 2A) and the display area DA (FIG. 1A) than the second bump BP2. The first bump BP1 may be disposed to correspond to the non-bending area NBA, and the second bump BP2 may be disposed to correspond to the facing area FA of the bending area BA. In an embodiment, the non-display area NDA (FIG. 1A) may correspond to the bending area BA of a flat display device (FIG. 6A) from which a curved display device will be formed.

FIG. 6B is a perspective view illustrating a rear surface of the support member 500. The bending axis BX may lengthwise extend in a direction parallel to the first direction D1. Thus, a length of the recessed portion HM may also extend in the first direction D1 in which the bending axis BX extends. Correspondingly thereto, the first bump BP1 and the second bump BP2 may be disposed with the recessed portion HM interposed therebetween and may also have lengths extending in the first direction D1 corresponding to the length-extending direction of the bending axis BX.

Figure 7:
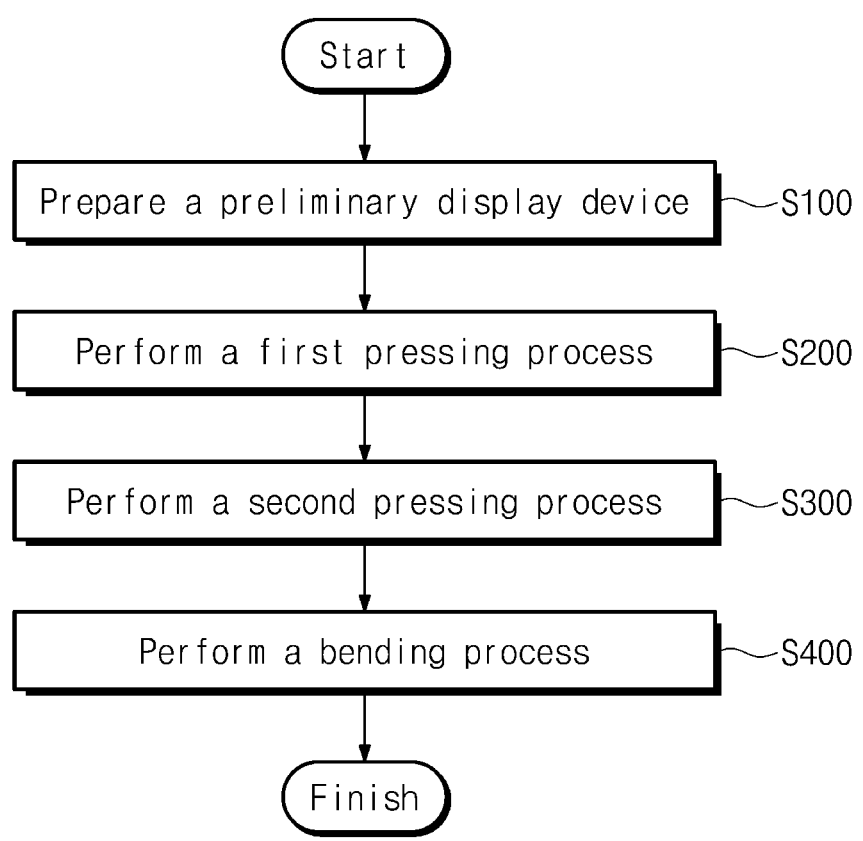
FIG. 7 is a flowchart illustrating an embodiment of a method of manufacturing a display device, according to the invention.

FIG. 7 is a flowchart illustrating an embodiment of a method of manufacturing a display device, according to the invention. A method of manufacturing a display device may include providing a preliminary display device (S100), performing a first pressing process (S200), performing a second pressing process (S300), and performing a bending process (S400). Hereinafter, the method of manufacturing a display device will be described with reference to FIGS. 8A to 8F.

Figure 8A:
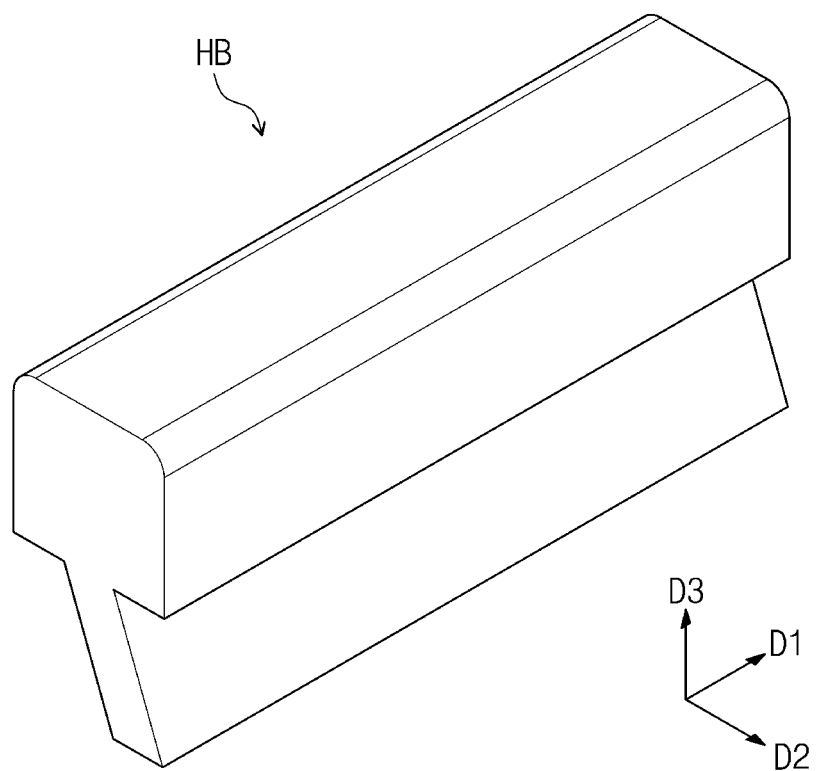
FIG. 8A is a perspective view illustrating an embodiment of a heating block used in a method of manufacturing a display device, according to the invention.

FIG. 8A is a perspective view illustrating an embodiment of a heating block used in a process of manufacturing the display device according to the invention. As illustrated in FIG. 8A, a heating block HB may have an overall bar shape. The heating block HB may include a material having relatively high thermal conductivity. In an embodiment, for example, the heating block HB may include a metal or an alloy such as stainless steel. The heating block HB may provide heat to the support member 500 to process the support member 500 in a process of manufacturing the display device according to the invention.

FIGS. 8B to 8F are cross-sectional views illustrating an embodiment of the method of manufacturing the display device. Where FIGS. 8B to 8F illustrate some components of the display device 1000 described in previous embodiments, remaining components are omitted for convenience of illustration of the method of manufacturing the display device.

As illustrated in FIGS. 8A and 8B, the heating block HB may be aligned on a preliminary display device structure in the operation S100 of providing the preliminary display device. The preliminary display device may be provided by applying or forming a base support member 500A on a bottom surface (or a rear surface) of the display panel 400 of the display device 1000 described with reference to FIGS. 2A and 2B. The base support member 500A may completely cover the bottom surface of the display panel 400. The preliminary display device in operation S100 may include at least the base support member 500A, the display panel 400 and adhesive layers respectively thereon or therebetween, without being limited thereto.

The heating block HB may be aligned on the base support member 500A to melt a first press area AA of the base support member 500A. The first press area AA may correspond to a position which is between two bumps to be formed from the base support member 500A. The heating block HB may be heated to a predetermined temperature after being aligned with the base support member 500A. The heating block HB may apply a pressure to the first press area AA in a state in which the heating block HB is heated to a temperature higher than a melting point of a material of the base support member 500A. In an embodiment, for example, when a polyethylene terephthalate ("PET") film is applied to or forms a material of the base support member 500A, the heating block HB may be heated to a temperature higher than about 250 degrees Celsius (° C.). The maximum temperature of the heating block HB may be set in consideration of the material forming the base layer SUB of the display panel 400 (refer to FIGS. 2A and 2B). The heating temperature of the heating block HB may be set as a temperature at which a material of the base support member 500A is melted to be deformable but at which thermal damage of the base layer SUB does not occur. In an embodiment, when the base layer SUB includes polyimide ("PI"), the maximum heating temperature of the heating block HB may be lower than about 600 degrees Celsius.

With the heating block HB at temperature to deform the base support member 500A, as illustrated in FIG. 8C, the heated heating block HB may be pressed to the first press area AA if the base support member 500A in the operation S200 of performing the first pressing process. A first bump BP1 and a preliminary bump BP2A are formed by melting the base support member 500A by the temperature of the heating block HB and pressing the heated heating block HB to the first press area AA of the base support member 500A. At this time, a size of the first bump BP1 may be similar to a size of the preliminary bump BP2A. In cross-section, a thickness of the base support member 500A at the first press area AA is smaller than an original thickness (FIG. 8B) of the base support member 500A, and a thickness at the first bump BP1 and the preliminary bump BP2A is larger than that the original thickness (FIG. 8B) of the base support member 500A.

As illustrated in FIG. 8D, in the operation S300 of performing the second pressing process, the heating block HB may be aligned with a second press area BB adjacent to the first press area AA and then may press the second press area BB of the base support member 500A. The first press area AA may be closer to the display element layer PL (see FIGS. 2A and 2B) of the display panel 400 than the second press area BB. A second bump BP2 may be formed by pressing the base support member 500A at the second press area BB thereof. An overall pressed portion of the base support member 500A may include the first and second pressed areas AA and BB such that at least a portion of the first press area AA may overlap with at least a portion of the second press area BB.

The materials of the base support member 500A at the press areas thereof may be melted by the heated heating block HB and may be moved from the pressing areas to be accumulated at positions in both of opposing directions parallel to the second direction D2 (e.g., in the second direction D2 and in a direction opposite thereto), thereby forming the first bump BP1 and the second bump BP2. The second bump BP2 is formed by increasing a size of the preliminary bump BP2A. Thus, in the cross-sectional view, a thickness of the base support member 500A of the press areas from which material of the base support member 500A is moved to form the first and second bumps BP1 and BP2 may be less than a thickness of the base support member 500A at remaining areas thereof except the press areas.

In addition, the portion of the base support member 500A which is pressed by the heating block HB may be formed into a recessed portion HM of a final support member of a display device. The thickness of the base support member 500A at the recessed portion HM thereof including both the first and second press areas AA and BB, is smaller than that of the base support member 500A including only the first press area AA (FIG. 8C). The recessed portion HM may correspond to at least a portion of a bending area BA at which a display device is bent with reference to a bending axis BX in the subsequent operation S400 of performing the bending process.

Since the second press area BB is farther away from the display element layer PL than the first press area AA, the first bump BP1 formed by the heating block HB may be closer to the display element layer PL than the second bump BP2 formed by the heating block HB. With the first and second bumps BP1 and BP2 formed, the base support member 500A may be formed therefrom into a support member 500 (see FIG. 8E) for a display device.

As illustrated in FIG. 8E, a protective film 600 may be provided on the support member 500 adjacent to the first bump BP1 thereof. In more detail, the protective film 600 may be provided on an adhesive layer OC5 which corresponds to the non-bending area NBA and is applied onto the support member 500 to overlap with at least a portion of the first bump BP1.

Figure 8F:
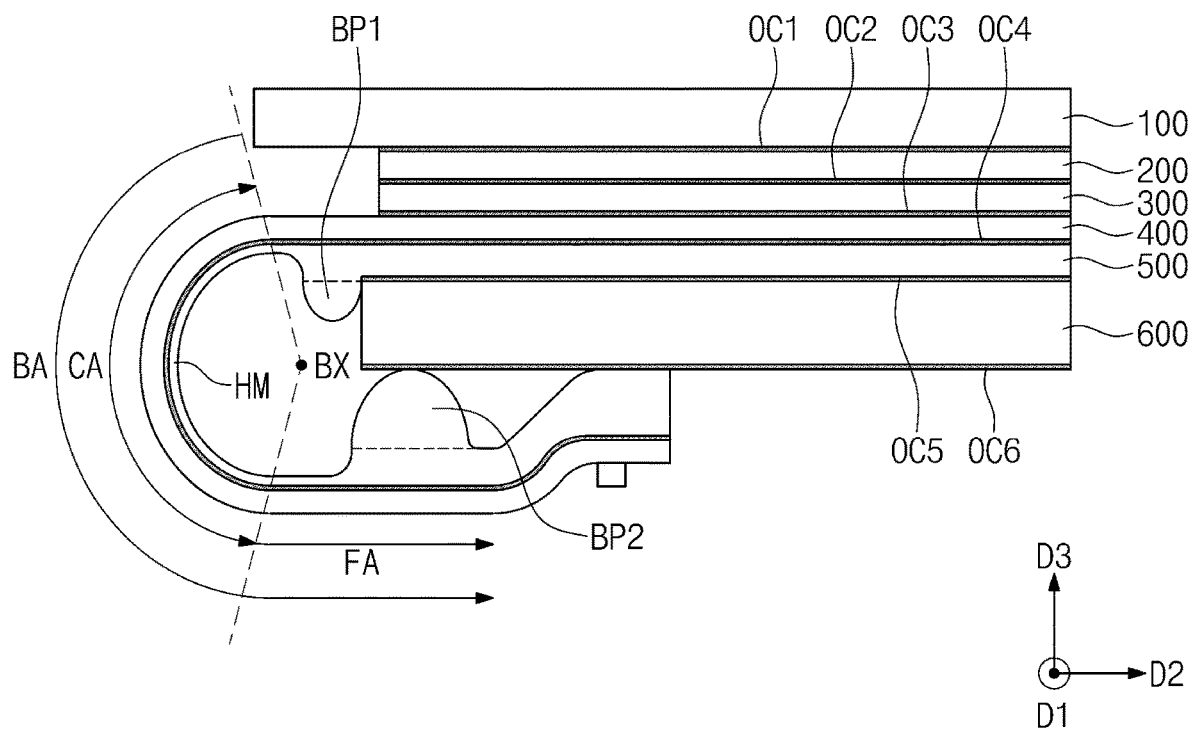

As illustrated in FIG. 8F, the display device 1000 structure may be bent with reference to the bending axis BX in the operation S400 of performing the bending process. The first bump BP1 formed by the pressing processes may be provided to be disposed in the non-bending area NBA, and the second bump BP2 formed by the pressing processes may be disposed in the bending area BA and may be coupled to a bottom of the protective film 600. In more detail, the second bump BP2 may be coupled to an adhesive OC6 applied onto one surface of the protective film 600.

In the method of manufacturing the display device according to the embodiment of the invention, the first and second bumps BP1 and BP2 having different sizes from each other may be formed by a single one heating block HB.

Since the first bump BP1 having a relatively small size is provided adjacent to the display element layer PL of the display panel 400, reducing or minimizing an undesired space which is formed in the non-display area NDA (see FIG. 1) by a conventional bump in a conventional display device is possible. The second bump BP2 may be in contact with the bottom of the protective film 600, and thus the second bump BP2 may act as the spacer to improve an overall mechanical strength of the display device 1000.

In the display device according to one or more embodiment of the invention, the structure of the bump disposed in the bending area may be different from the structure of the bump disposed in the non-bending area. Thus, an undesired space generated in bending may be reduced and the overall mechanical strength of the display device may be improved.

In the method of manufacturing the display device according to the invention, the bumps having different sizes may be formed from a same material layer by using the heating block to transition the material layer to be in a deformable state, and thus the non-display area may be reduced.

While the invention has been described with reference to example embodiments, it will be apparent to those skilled in the art that various changes and modifications may be made without departing from the spirits and scopes of the invention. Therefore, it should be understood that the above embodiments are not limiting, but illustrative. Thus, the scope of the invention are to be determined by the broadest permissible interpretation of the following claims and their equivalents, and shall not be restricted or limited by the foregoing description.

What is claimed is:

1. A display device comprising:
 a display panel which is bendable and displays an image; and
 a support member which faces the display panel and is bendable with the display panel, the support member comprising:
  a bending area at which the display panel is bendable with reference to a bending axis;
  a non-bending area which extends from the bending area and at which the image is displayed;
  a recessed portion disposed in the bending area;
  a plurality of bumps spaced apart from each other to define the recessed portion therebetween, including a first bump in the non-bending area and a second bump in the bending area; and
  extensions extended from the first bump and the second bump in a direction away from the recessed portion, to opposing ends of the support member, respectively,
 wherein
  in cross-section of the display panel, a thickness of the support member at the first bump and a thickness of the support member at the second bump, are both greater than a thickness of the support member at each of the extensions, and
  the thickness of the support member at the first bump is smaller than the thickness of the support member at the second bump.

2. The display device of claim 1, wherein the recessed portion of the support member extends in a same direction in which the bending axis extends.

3. The display device of claim 2, wherein in cross-section of the display panel, a maximum thickness of the support member at the recessed portion thereof is less than a minimum thickness of the support member at the extensions.

4. The display device of claim 1, wherein the display panel which is unbent disposes:
 the first bump of the support member overlapping the non-bending area of the display panel, and
 the second bump of the support member overlapping the bending area of the display panel.

5. The display device of claim 4, wherein lengths of the first bump and the second bump extend parallel to a direction in which a length of the bending axis extends.

6. The display device of claim 5, wherein the display panel which is unbent disposes:
 the bending area of the display panel extending from the non-bending area thereof in an extending direction, and
 in the extending direction, a width of the first bump of the support member which is less than a width of the second bump of the support member.

7. The display device of claim 1, further comprising:
 in the non-bending area of the display panel, a first protective film,
 wherein
  the support member is between the first protective film and the display panel, and
  the display panel which is bent with reference to the bending axis adheres the second bump to the first protective film.

8. The display device of claim 7, wherein
 the first protective film defines an opening in the non-bending area of the display panel,
 the display panel which is unbent disposes the opening spaced apart from the recessed portion by the first bump, and
 the display panel which is bent with reference to the bending axis disposes the second bump of the support member extended into the opening in the non-bending area of the display panel.

9. The display device of claim 7, further comprising a second protective film in the non-bending area of the display panel,
 wherein
  the first protective film is between the second protective film and the support member,
  the first protective film and the second protective film form a stepped region in the non-bending area of the display panel,
  the display panel which is unbent disposes the stepped region spaced apart from the recessed portion by the first bump, and
  the display panel which is bent with reference to the bending axis disposes the second bump of the support member in contact with an inner surface of the first protective film or the second protective film at the stepped region formed therewith.

10. The display device of claim 1, further comprising:
 a window member which is disposed on the display panel and through which the image displayed by the display panel is viewable outside the display device;
 an anti-reflection layer disposed between the window member and the display panel; and
 an input sensing layer with which an input to the display device is sensed,
 wherein the anti-reflection layer is between the window member and the input sensing layer.

11. The display device of claim 1, wherein the support member includes a thermoplastic resin.

12. A display device comprising:
 a base member which is bendable and includes a first area at which an image is displayed, and a second area which extends from the first area in a first direction and at which the base member is bendable;

a display element layer with which the image is displayed, disposed on the base member in the first area thereof;

a driving circuit electrically connected to the display element layer and with which the display element layer is controlled to display the image, disposed on the base member in the second area thereof;

a signal line electrically connecting the display element layer in the first area to the driving circuit in the second area; and a support member which is bendable with the base member and faces each of the display element layer, the driving circuit and the signal line with the base member therebetween, the support member defining:

a recessed portion;

a plurality of bumps spaced apart from each other in the first direction to define the recessed portion therebetween, including a first bump in the first area and a second bump in the second area; and extensions extending away the first bump and the second bump, to opposing ends of the support member, respectively, wherein a thickness of the support member at the first bump and a thickness of the support member at the second bump are both greater than a thickness of the support member at each of the extensions, and in cross-section, the thickness of the support member at the first bump is smaller than the thickness of the support member at the second bump.

13. The display device of claim 12, wherein a length of the recessed portion of the support member extends in a second direction intersecting the first direction.

14. The display device of claim 12, wherein in cross-section of the base member, a minimum thickness of the support member at the extensions is greater than a maximum thickness of the support member at the recessed portion thereof.

15. The display device of claim 12, wherein from the thickness of the support member at each of the extensions, a maximum height of the support member at the first bump is less than a maximum height of the support member at the second bump.

16. The display device of claim 12, wherein the base member which is unbent disposes along the first direction, a width of the first bump is less than a width of the second bump.

* * * * *